United States Patent
Hui et al.

(10) Patent No.: US 8,102,235 B2
(45) Date of Patent: Jan. 24, 2012

(54) CORELESS PRINTED-CIRCUIT-BOARD (PCB) TRANSFORMERS AND OPERATING TECHNIQUES THEREFOR

(75) Inventors: Shu Yuen Ron Hui, New Territories (HK); Sai Chun Tang, Sha Tin (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 12/847,638

(22) Filed: Jul. 30, 2010

(65) Prior Publication Data
US 2011/0050292 A1 Mar. 3, 2011

Related U.S. Application Data

(63) Continuation of application No. 11/067,103, filed on Feb. 25, 2005, now Pat. No. 7,768,371, which is a continuation of application No. 09/316,735, filed on May 21, 1999, now abandoned, which is a continuation-in-part of application No. 09/018,871, filed on Feb. 5, 1998, now abandoned.

(51) Int. Cl.
*H01F 5/00* (2006.01)

(52) U.S. Cl. ....... 336/200; 336/84 C; 336/181; 336/223; 336/232; 363/28; 363/67; 363/134; 363/135; 307/104; 307/108; 327/434; 327/427

(58) Field of Classification Search ............... 336/200, 336/223, 232, 84 C, 181, 182, 107, 145; 363/17, 363/21.02, 24, 27, 28, 34, 64, 67, 68, 69, 363/134, 135; 307/104, 108; 327/434, 427
See application file for complete search history.

(56) References Cited

U.S. PATENT DOCUMENTS

| 3,805,094 A * | 4/1974 | Orlando ................... 327/482 |
| 3,866,086 A | 2/1975 | Miyoshi et al. ............ 315/411 |
| 4,383,292 A * | 5/1983 | Onodera et al. ........ 363/21.04 |
| 4,386,395 A * | 5/1983 | Francis, Jr. ................. 363/27 |
| 4,494,100 A | 1/1985 | Stengel et al. ............ 336/200 |
| 4,510,915 A | 4/1985 | Ishikawa et al. .......... 123/620 |
| 4,584,635 A * | 4/1986 | MacInnis et al. ........... 363/25 |

(Continued)

FOREIGN PATENT DOCUMENTS
EP 0147499 7/1985
(Continued)

OTHER PUBLICATIONS

Bourgeois, *IEEE APE*, "PCB Based Transformer for Power MOSFET Drive," pp. 238-244, 1994.

(Continued)

*Primary Examiner* — Anh Mai
*Assistant Examiner* — Joselito Baisa
(74) *Attorney, Agent, or Firm* — Heslin Rothenberg Farley & Mesiti P.C.

(57) ABSTRACT

Optimal operating techniques are disclosed for using coreless printed-circuit-board (PCB) transformers under (1) minimum input power conditions and (2) maximum energy efficiency conditions. The coreless PCB transformers should be operated at or near the 'maximum impedance frequency' (MIF) in order to reduce input power requirement. For maximum energy efficiency, the transformers should be at or near the "maximum efficiency frequency" (MEF) which is below the MIF. The operating principle has been confirmed by measurement and simulation. The proposed operating techniques can be applied to coreless PCB transformers in many circuits that have to meet stringent height requirements, for example to isolate the gates of power MOSFET and IGBT devices from the input power supply.

15 Claims, 39 Drawing Sheets

U.S. PATENT DOCUMENTS

Figure 1A:
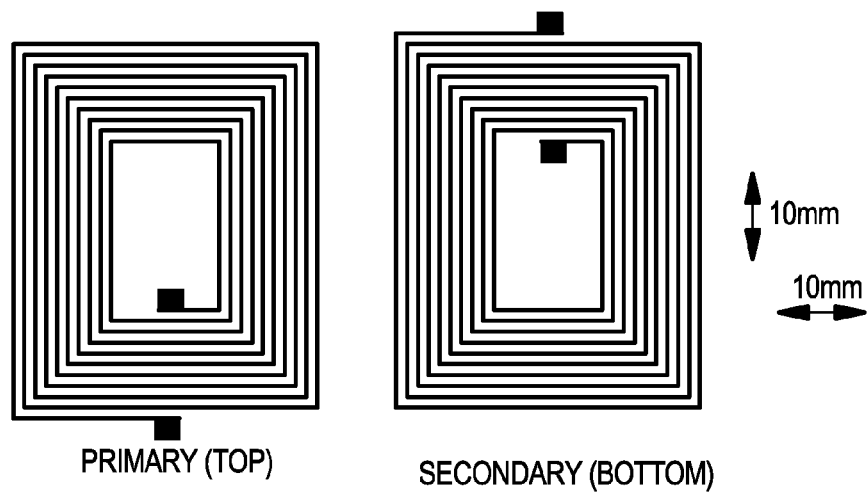

| | | | | |
|---|---|---|---|---|
| 4,586,119 A | * | 4/1986 | Sutton | 363/17 |
| 4,613,843 A | | 9/1986 | Esper et al. | 336/232 |
| 4,713,220 A | * | 12/1987 | Huynh et al. | 422/186.16 |
| 4,725,938 A | * | 2/1988 | Onodera | 363/28 |
| 4,748,532 A | | 5/1988 | Commander et al. | 361/31 |
| 5,015,972 A | | 5/1991 | Cygan et al. | 333/32 |
| 5,039,964 A | | 8/1991 | Ikeda | 333/181 |
| 5,331,536 A | | 7/1994 | Lane | 363/126 |
| 5,339,029 A | * | 8/1994 | Wagner | 324/207.17 |
| 5,431,987 A | | 7/1995 | Ikeda | 428/209 |
| 5,451,914 A | | 9/1995 | Stengel | 333/25 |
| 5,537,021 A | | 7/1996 | Weinberg et al. | 320/1 |
| 5,579,202 A | | 11/1996 | Tolfsen et al. | 361/232 |
| 5,670,848 A | | 9/1997 | Lidström | 315/282 |
| 5,844,451 A | | 12/1998 | Murphy | 333/185 |
| 6,043,644 A | * | 3/2000 | de Coulon et al. | 324/207.18 |
| 6,094,116 A | * | 7/2000 | Tai et al. | 335/78 |
| 6,593,841 B1 | * | 7/2003 | Mizoguchi et al. | 336/200 |
| 6,927,662 B2 | * | 8/2005 | Kahlmann et al. | 336/200 |

FOREIGN PATENT DOCUMENTS

| | | |
|---|---|---|
| EP | 04-010680 | 1/1992 |
| JP | 54-110424 | 8/1979 |
| JP | 60-70968 | 4/1985 |
| JP | 04-151810 | 5/1992 |

OTHER PUBLICATIONS

J. Wiley, Ravender Goyal, "High-Frequency Analog Integrated Circuit Design," pp. 107-126, 1995.

Hui et al., "Coreless printed-circuit board transformers for signal and energy transfer," *Electronics Letters*, vol. 34, No. 11, pp. 1052-1054 (May 1998).

Hui et al., "Some electromagnetic aspects of coreless PCB transformers," *IEEE Transactions on Power Electronics*, vol. 15, No. 4, pp. 805-810 (Jul. 2000).

Onda et al., "Thin type DC/DC converter using a coreless wire transformer," *IEEE Power Electronics Specialists Conference*, pp. 1330-1334 (Jun. 1994).

Coombs, C.F., "Printed Circuits Handbook," $3^{rd}$ Ed. McGraw-Hill, p. 6.32 (1998).

Tang et al., "Characterization of coreless printed circuit board (PCB) transformers," *IEEE Transactions on Power Electronics*, vol. 15, No. 6, pp. 1275-1282 (Nov. 2000).

Paul, C.R., *Introduction to Electromagnetic Compatibility*, Chapter 11—Shielding, pp. 632-637 (1992).

Tang et al., "A low-profile power converter using printed-circuit board (PCB) power transformer with ferrite polymer composite, "*IEEE Transactions on Power Electronics*, vol. 16, No. 4, pp. 493-498 (Jul. 2001).

Hui et al., "Coreless PCB based transformers for power MOSFET/IGBT gate drive circuits," *IEEE Power Electronics Specialists Conference*, vol. 2, pp. 1171-1176 (1997).

Tang et al., "Coreless planar printed-circuit-board (PCB) transformers—A fundamental concept for signal and energy transfer," *IEEE Transactions on Power Electronics*, vol. 15, No. 5, pp. 931-941 (Sep. 2000).

* cited by examiner

CORELESS PRINTED-CIRCUIT-BOARD (PCB) TRANSFORMERS AND OPERATING TECHNIQUES THEREFOR

CROSS-REFERENCE TO RELATED APPLICATIONS

This application is a Continuation of U.S. patent application Ser. No. 11/067,103 filed Feb. 25, 2005, which is a Continuation of U.S. patent application Ser. No. 09/316,735 filed May 21, 1999, now abandoned, which is a Continuation-In-Part of U.S. patent application Ser. No. 09/018,871 filed Feb. 5, 1998, now abandoned, the entirety of which are all hereby incorporated herein by reference.

FIELD OF THE INVENTION

This invention relates to PCB-based transformers, and in particular to coreless PCB-based transformers and to optimal operating techniques for such transformers.

BACKGROUND OF THE INVENTION

Transformers are commonly used for energy and signal transfer and for providing electrical isolation. Commonly used magnetic core-based transformers require a manual winding process, which not only increases the labour cost but also prohibits full automation of the circuits in the manufacturing process. This disadvantage has prompted research efforts on making planar transformer and/or inductor windings on printed circuit boards (PCBs).

PRIOR ART

Recent research has been directed towards forming transformer and/or inductor windings directly on a printed circuit board (PCB). An example of this approach is to be found in J. M. Bourgeois. *"PCB Based Transformer for Power MOSFET Drive", IEEE APEC '94* pp. 238-244. In addition to the cost factor, the idea of a PCB-based transformer and/or inductor is highly attractive because of the greater potential to automate the manufacturing process.

Bourgeois proposes a PCB-based transformer for isolating the gate drive circuit of a power MOSFET device. The transformer windings are printed on a double-sided PCB. However, in Bourgeois a ferrite core is still required, and while Bourgeois has the advantage of avoiding the use of a manually wound transformer, commonly used ferrite rings cannot be used in Bourgeois because it is impossible to put ferrite rings through the PCB without breaking the rings. Instead of using such ferrite rings, a U-I core set or a U-U core set can be glued together to form the required closed magnetic path.

Although Bourgeois makes some progress towards the desired reduced cost and increased automation, the advantage provided is limited by the requirement to provide a ferrite core and the need to use two core sets glued together.

SUMMARY OF THE PRESENT INVENTION

It is an object of the present invention therefore to provide a coreless PCB-based transformer. By eliminating the need for a transformer core at all, cost is reduced and the automated manufacture considerably simplified. It is also an object of the invention to provide means for controlling the operating frequency of such coreless PCB-based transformers and to provide optimal operating techniques for coreless PCB transformers (1) under minimum input power requirement (such as in a gate drive circuit for a power mosfet) and (2) under maximum energy efficiency (such as in a power converter).

According to the present invention, therefore there is provided a coreless printed circuit board transformer comprising first and second windings deposited on opposed sides of a printed circuit board and having no transformer core therebetween.

By means of this arrangement the transformer may be formed directly on the PCB by conventional PCB fabrication techniques depositing the "windings" as conductive spiral tracks on opposite sides of a double-sided PCB. Since no ferrite transformer core is required the manufacture of the transformers according to the present invention may be made very simple and may be incorporated as part of an automated manufacturing process. The transformers may be used for both signal and energy transfer.

Depending on the precise dimensions of the transformer windings, the number of turns in both the primary and secondary windings, and the nature and size of any load applied to the secondary windings, the transformer may be operable over a wide range of frequencies. However, for signal transfer applications an optimum frequency may be found at which the input current is minimum and this optimum frequency corresponds to the frequency at which a transformer equivalent circuit impedance is at its maximum. Preferably means are provided for adjusting the resonant frequency of the transformer, and this may be achieved by connecting a capacitance across the secondary winding.

Generally, the transformer may have a useable range of from about 300 kHz to about 10 MHz. At frequencies below 300 kHz power loss in the transformer may become a serious problem. However, nonetheless even so the transformer may be used at lower frequencies successfully by using a modulated input technique. In particular the transformer may be operated by a high frequency carrier signal which in turn is modulated by a low frequency signal of interest. For example the carrier signal may be in the high frequency useable range of the transformer, eg from 300 kHz to 20 MHz, while the low frequency signal may be between 1 Hz and 300 kHz. The high frequency carrier signal may preferably be set to be the optimum frequency for the transformer.

The coreless PCB transformers of the present invention are particularly well adapted for use in gate drive circuits for power MOSFET (metal oxide semiconductor field effect transistor) and IGBT (insulated gate bipolar transistor) devices where they can provide isolation of the device from the power source.

According to the present invention therefore there is provided a gate drive circuit for a power MOSFET or IGBT device, wherein the gate of said device is isolated from an input power supply by a coreless printed circuit board transformer, said transformer comprising first and second windings deposited on opposed sides of a printed circuit board.

Again, the transformer may be operated in a frequency range of from 300 kHz to 20 MHz, but optimum performance may be obtained by operating the transformer at a frequency corresponding to a maximum impedance of the transformer. If it is desired to drive the gate at a frequency below the useable range of the transformer—for example in the range of from DC to 300 kHz, this may be done by using a modulation technique and modulating a high frequency carrier signal, preferably the optimum frequency for the transformer, with a low frequency switching signal which is demodulated after the transformer to provide a low frequency drive for the gate.

According to the present invention there is further provided a method of driving a gate of a power MOSFET or IGBT device comprising isolating said gate from a power supply by means of a coreless printed circuit board transformer, said transformer comprising first and second windings deposited on opposed sides of a printed circuit board with no transformer core therebetween.

The gate may be driven directly at a frequency of between 300 kHz and 20 MHz, but optimum performance may be achieved by using a frequency at which the impedance of the transformer is at a maximum. If it is desired to drive the gate at a lower frequency (say from DC to 300 kHz), this may also be done by using a modulation technique in which a carrier signal within the useable range of the transformer is modulated by the low frequency switching signal.

Viewed from another broad aspect the present invention provides a coreless printed circuit board transformer comprising first and second windings deposited on opposed sides of a printed circuit board and having no transformer core therebetween, and comprising means for adjusting the resonant frequency of the transformer.

As mentioned above the transformers of the present invention can be used for either signal or energy transfer, and another possible application of the careless PCB transformers of the present invention is as a replacement of the pulse transformer used in a modem for digital data communication. In a modem the data transfer rate is typically 56 kHz which is well within the DC to 300 kHz range.

Viewed from another broad aspect the present invention provides a coreless printed circuit board transformer comprising first and second windings deposited on opposed sides of a printed circuit board and having no transformer core therebetween, wherein the transformer is operated at an optimum frequency which is at or near the frequency at which the impedance of a transformer equivalent circuit is at its maximum.

The transformer is able to operate directly in a frequency range of from about 100 kHz to at least 20 MHz. If it is desired to operate at lower frequencies the transformer may be operated by a high-frequency carrier signal modulated by a low-frequency switching signal, the carrier signal being at a frequency corresponding to the maximum impedance of the transformer. Preferably in this embodiment the carrier signal is at a frequency of between 300 kHz and 20 MHz and the switching signal is at a frequency of between DC and 300 kHz.

One possible application for a transformer according to an embodiment of the present invention in a gate drive circuit for a power MOSFET or IGBT device in which the transformer is used to isolate the device from an input power supply.

Viewed from another aspect therefore the present invention provides a method of driving a gate of a power MOSFET or IGBT device comprising isolating the gate from a power supply by means of a coreless printed circuit board transformer, the transformer comprising first and second windings deposited on opposed sides of a printed circuit board with no transformer core therebetween, wherein the gate is driven at a frequency at which the impedance of the transformer is at a maximum.

At high-frequencies the gate may be driven directly by the transformer. If it is desired to operate the device at a lower frequency however, a modulation technique may be employed and a low frequency switching signal may be used to modulate a high-frequency carrier signal input to the transformer, the carrier signal being demodulated after said transformer to drive the gate at the low switching frequency, the carrier signal being at an optimum frequency corresponding to the maximum impedance of the transformer.

For an application such as in a power MOSFET or IGBT device the optimum frequency corresponds to a minimum power input frequency. For other applications other criteria may apply for the optimum frequency. For example, if the transformer is used as part of a power converter apparatus the optimum frequency is a maximum efficiency frequency which is found to be slightly lower than the frequency at which the transformer impedance is maximum.

Viewed from a still further aspect therefore the present invention provides power converter apparatus including a coreless printed circuit board transformer comprising first and second windings deposited on opposed sides of a printed circuit board and having no transformer core therebetween, wherein the transformer is operated at a maximum efficiency frequency which is slightly lower than the frequency at which the input impedance of a transformer equivalent circuit is at its maximum.

Figure 1B:
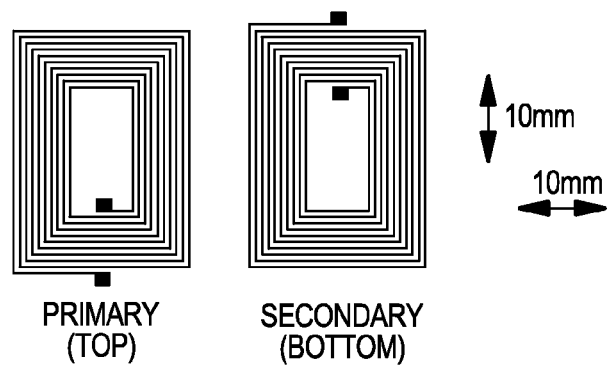
Figure 1C:
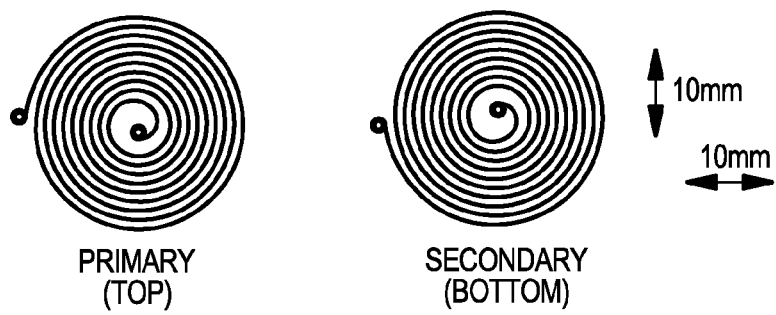
Figure 1D:
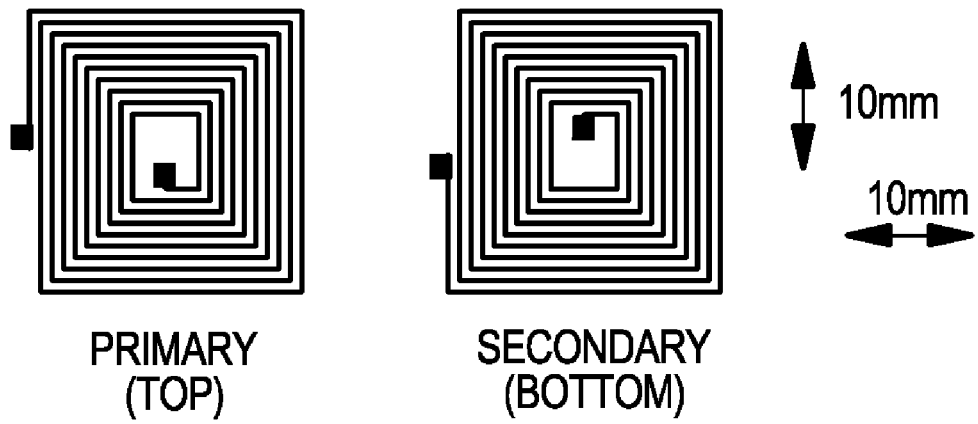
Figure 1E:
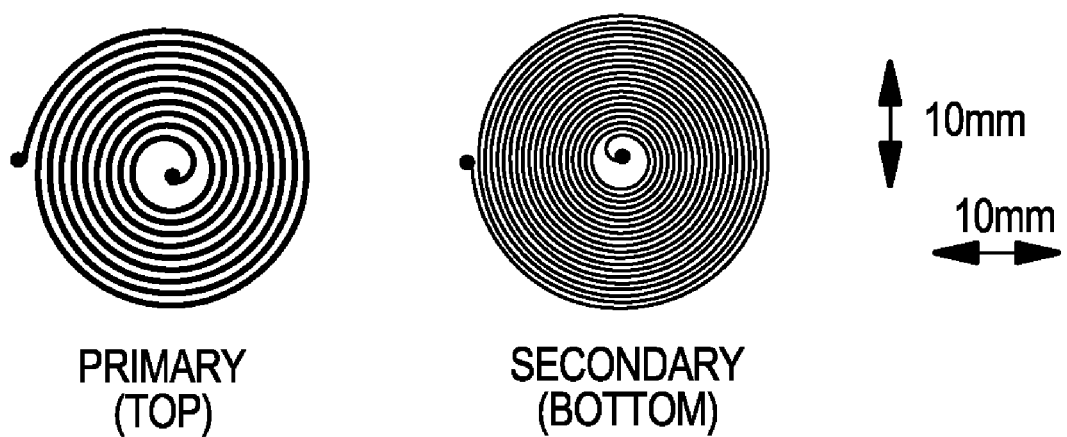
Figure 2:
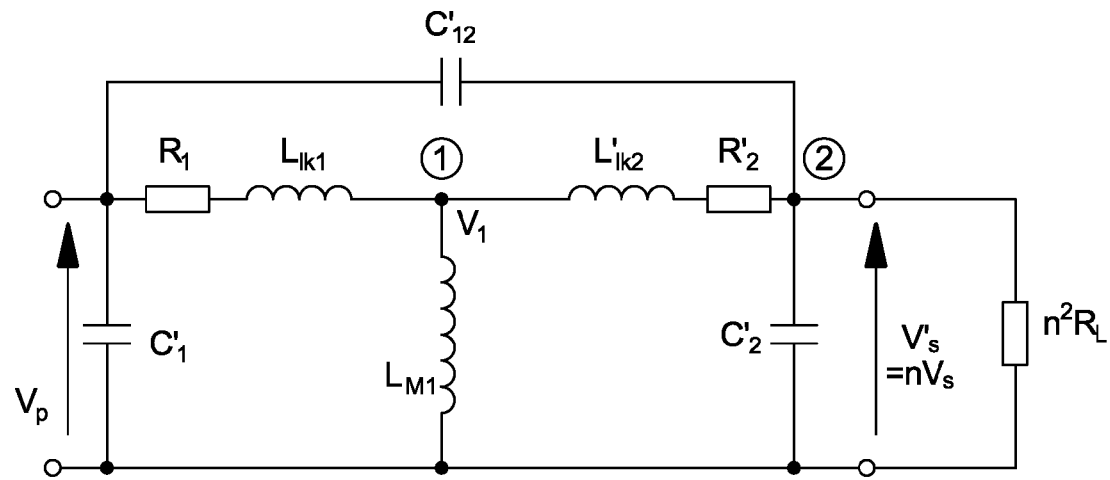
Figure 3:
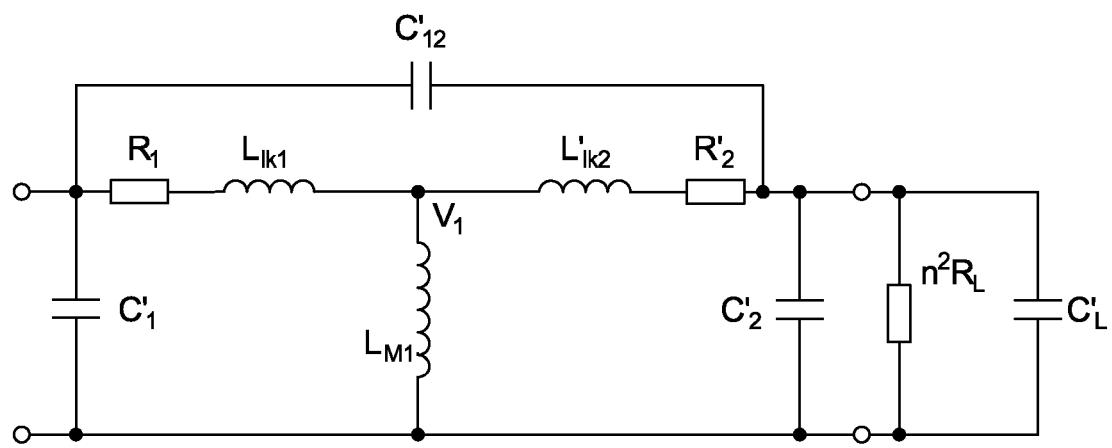
Figure 4A:
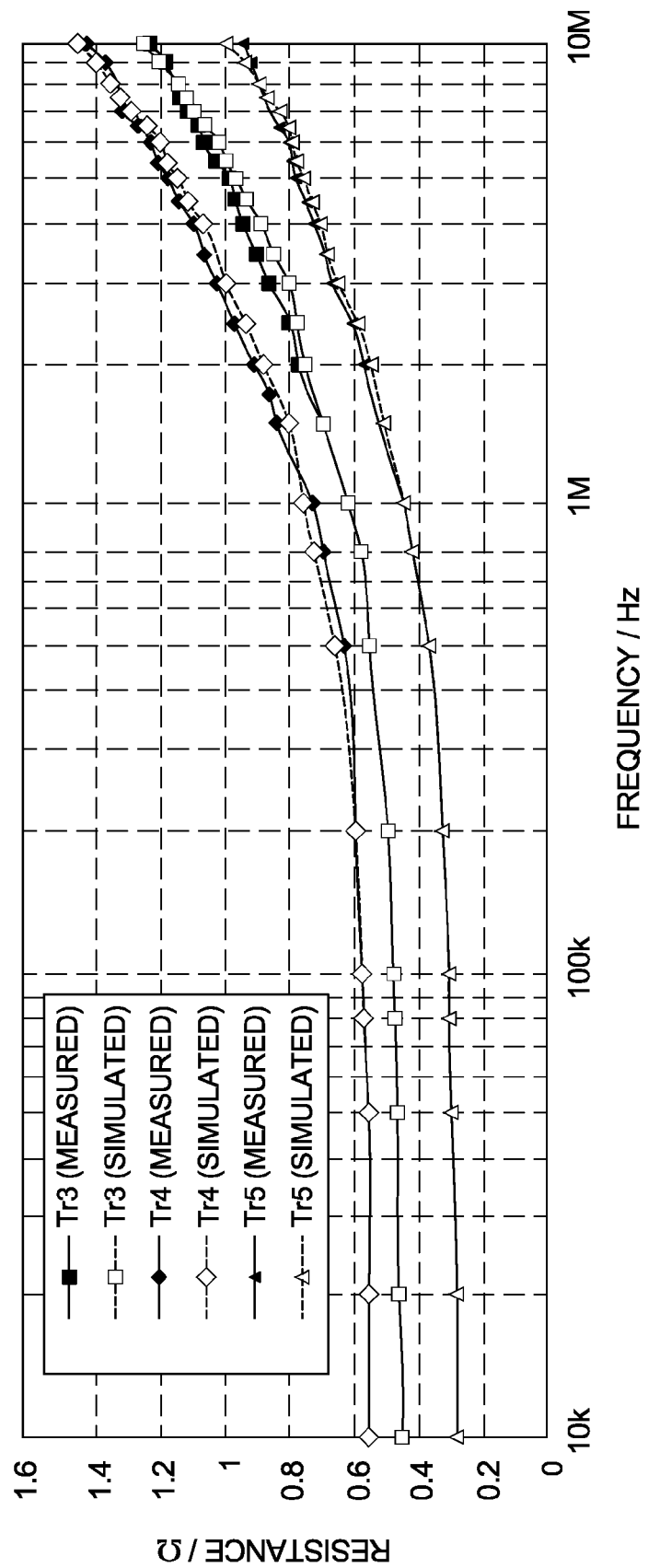
Figure 4B:
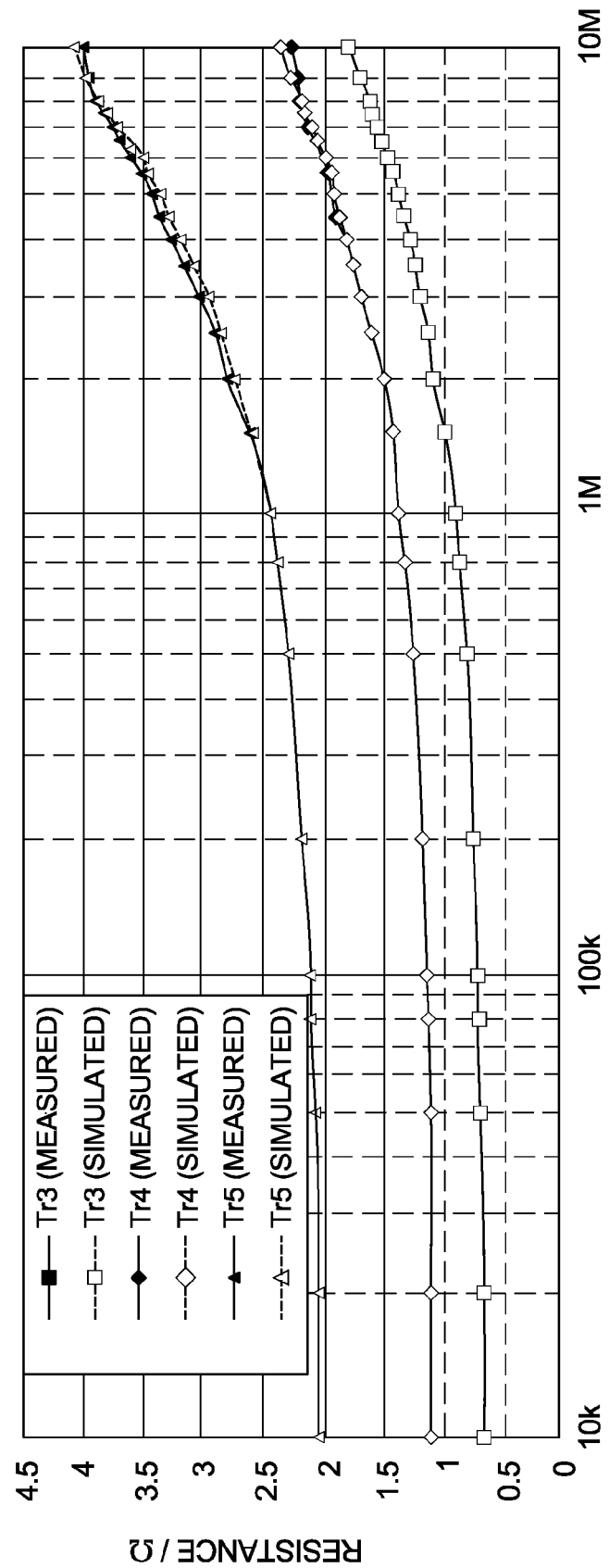
Figure 5A:
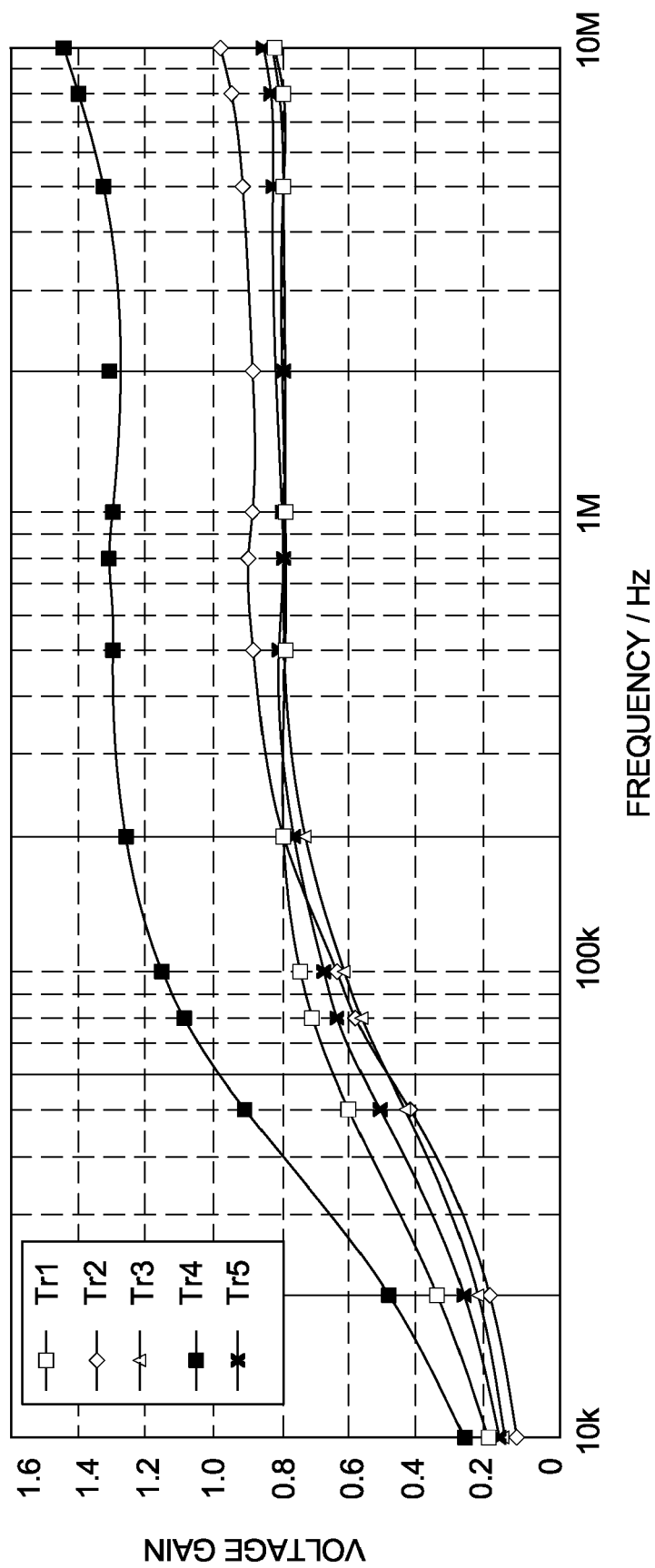
Figure 6A:
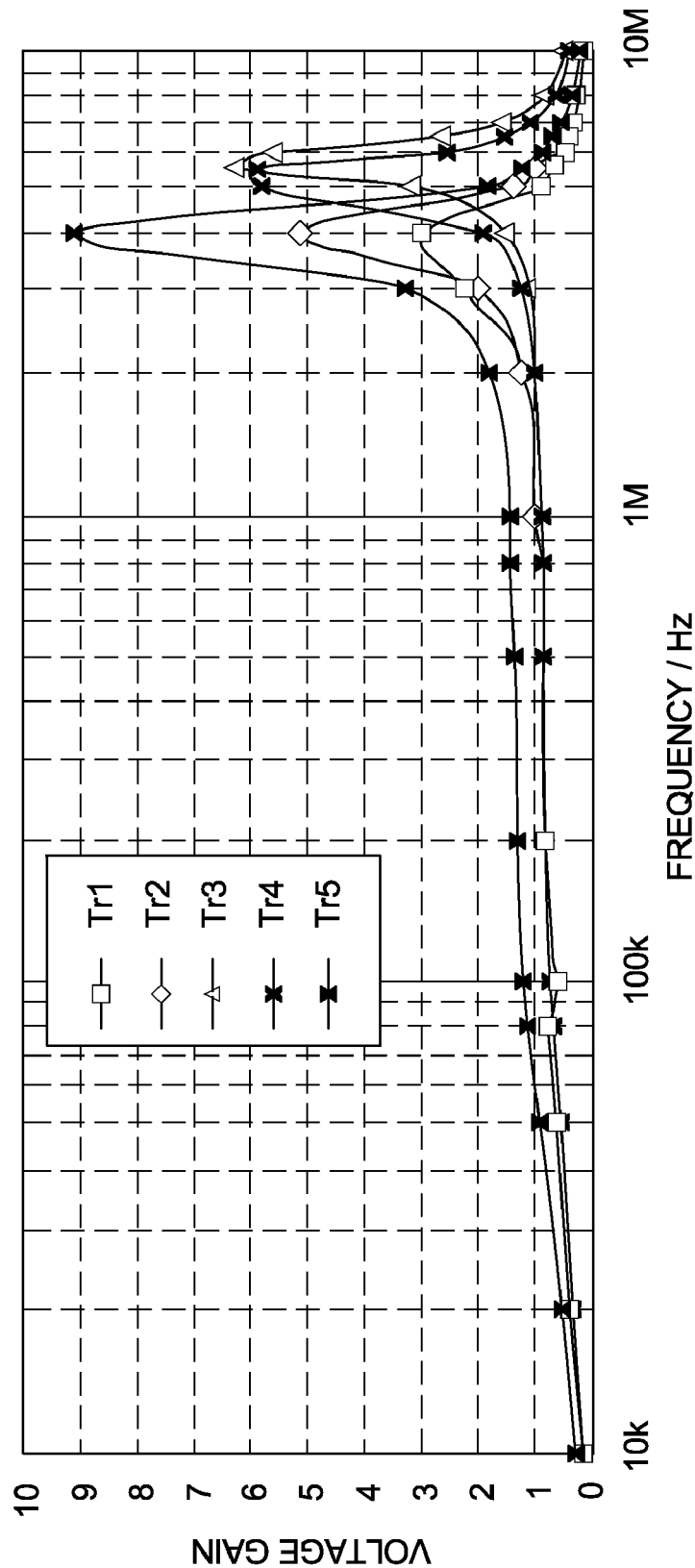
Figure 7A:
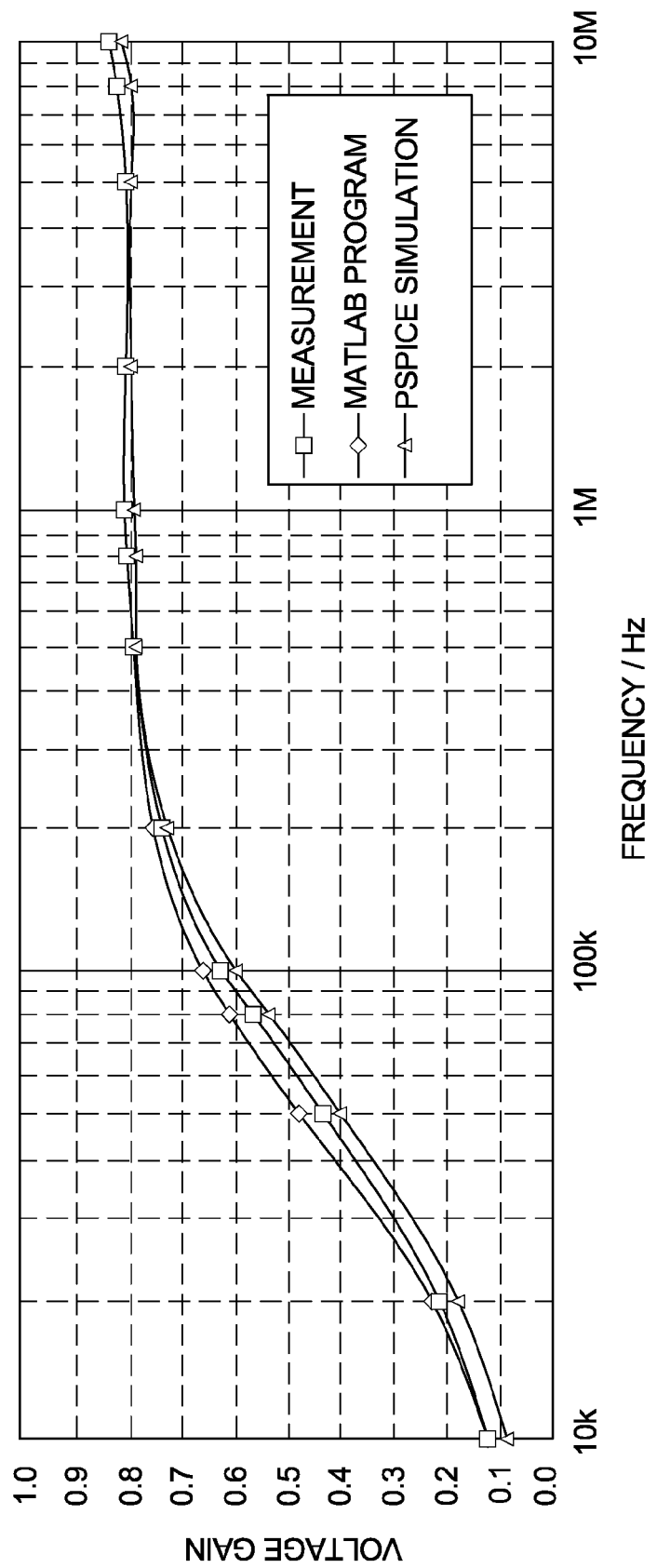
Figure 7B:
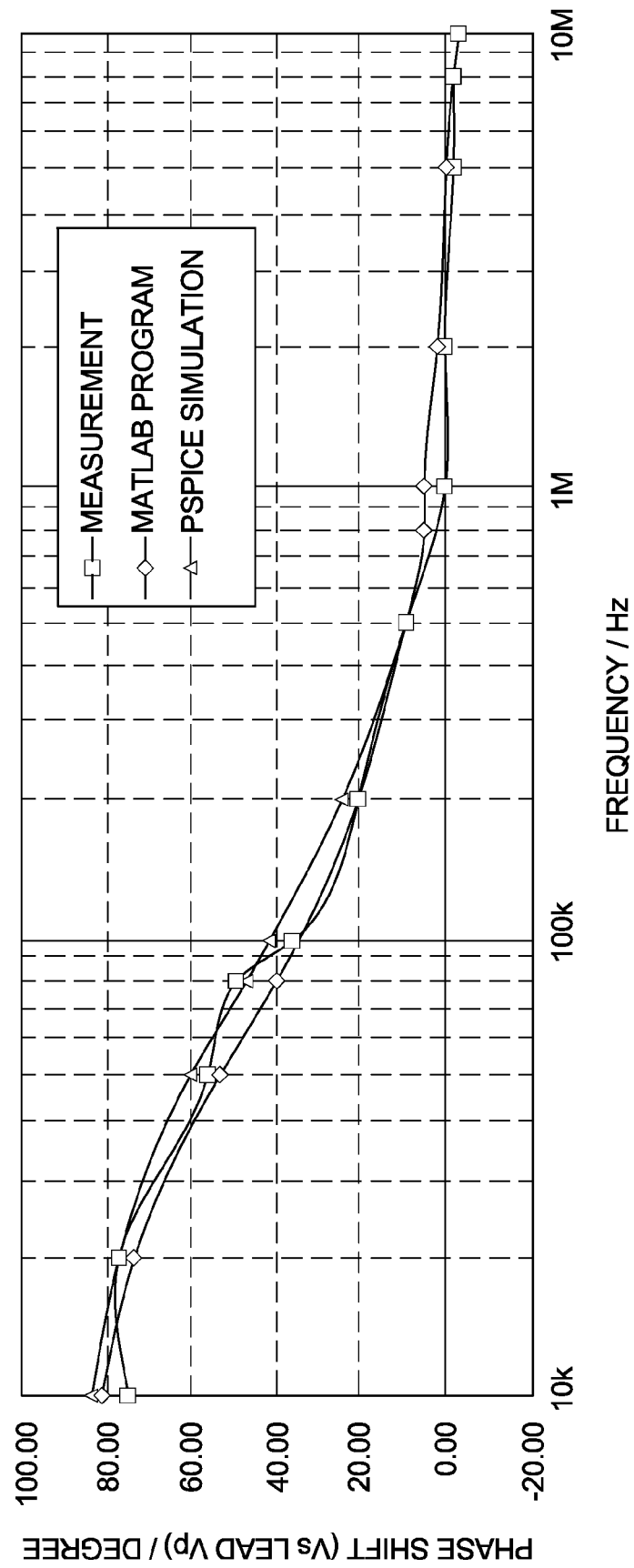
Figure 8A:
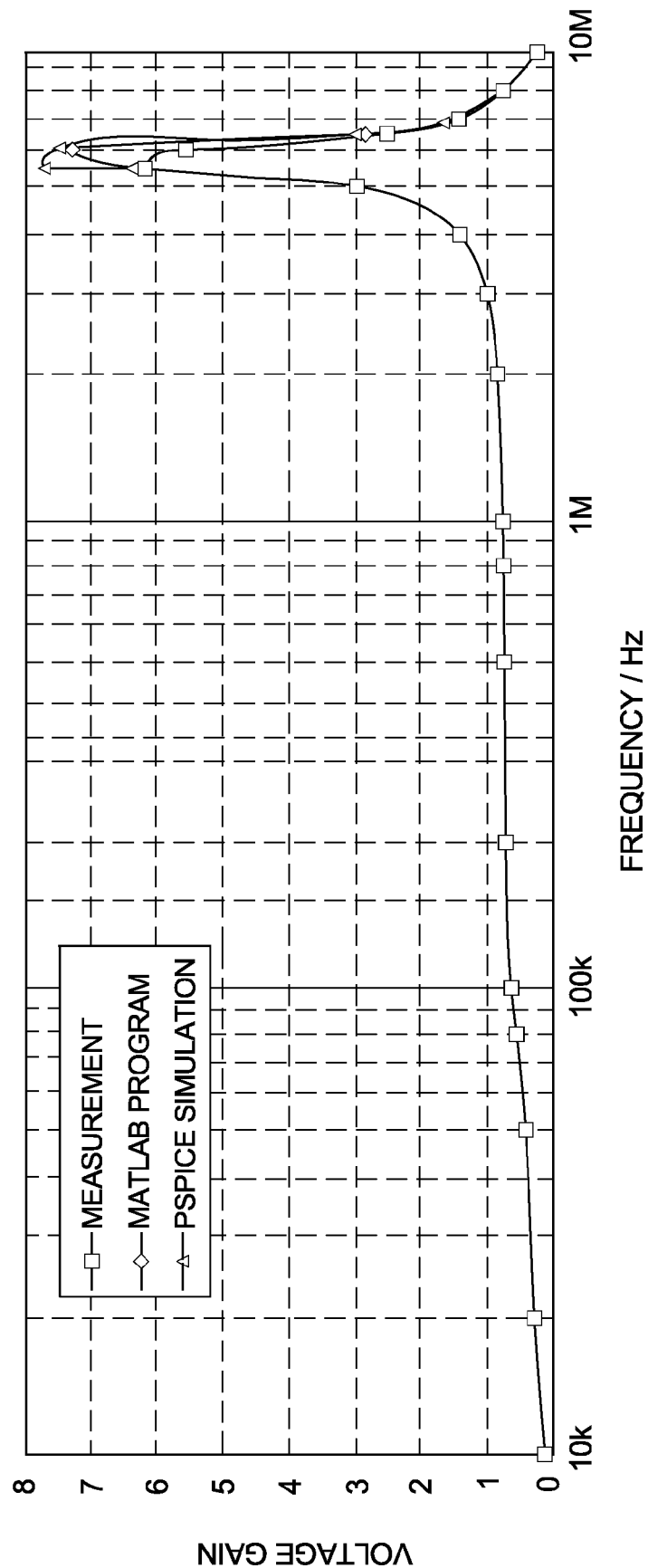
Figure 8B:
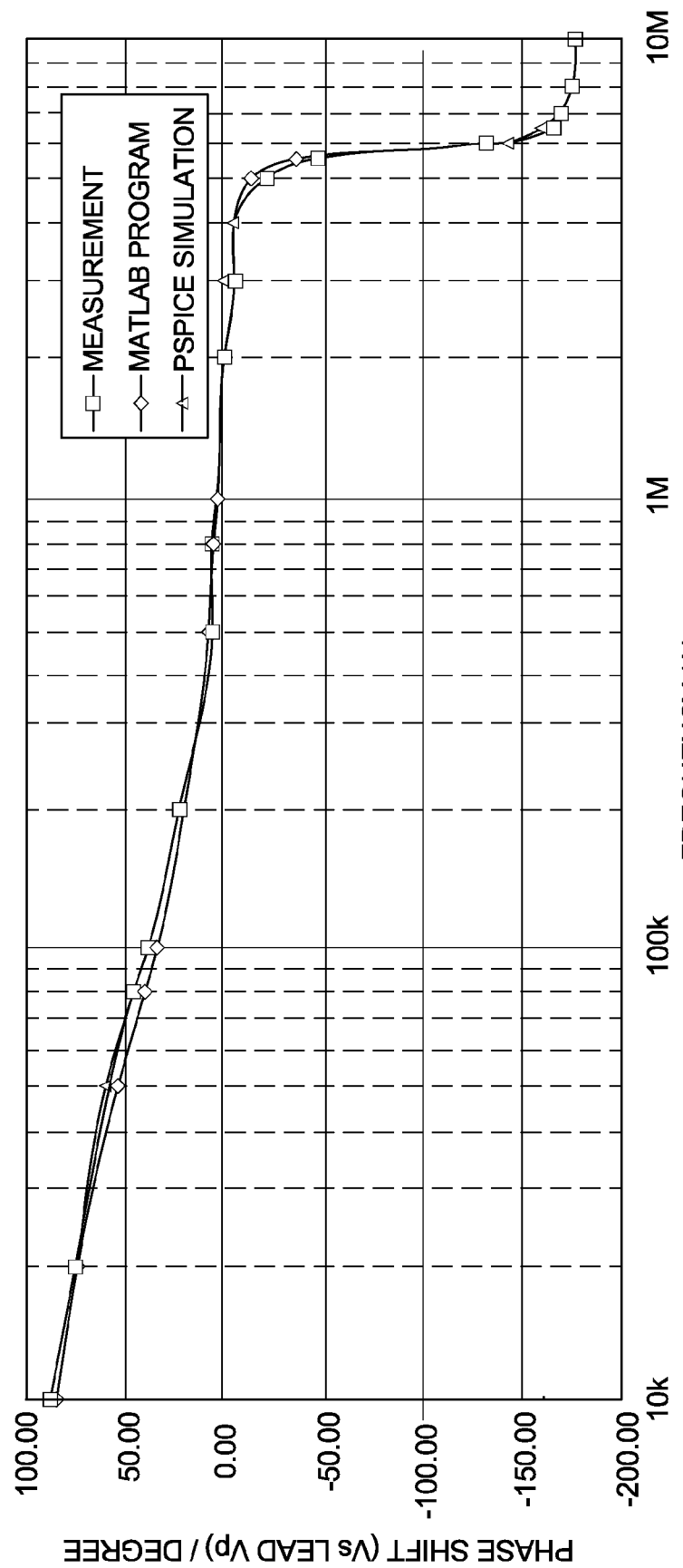
Figure 9:
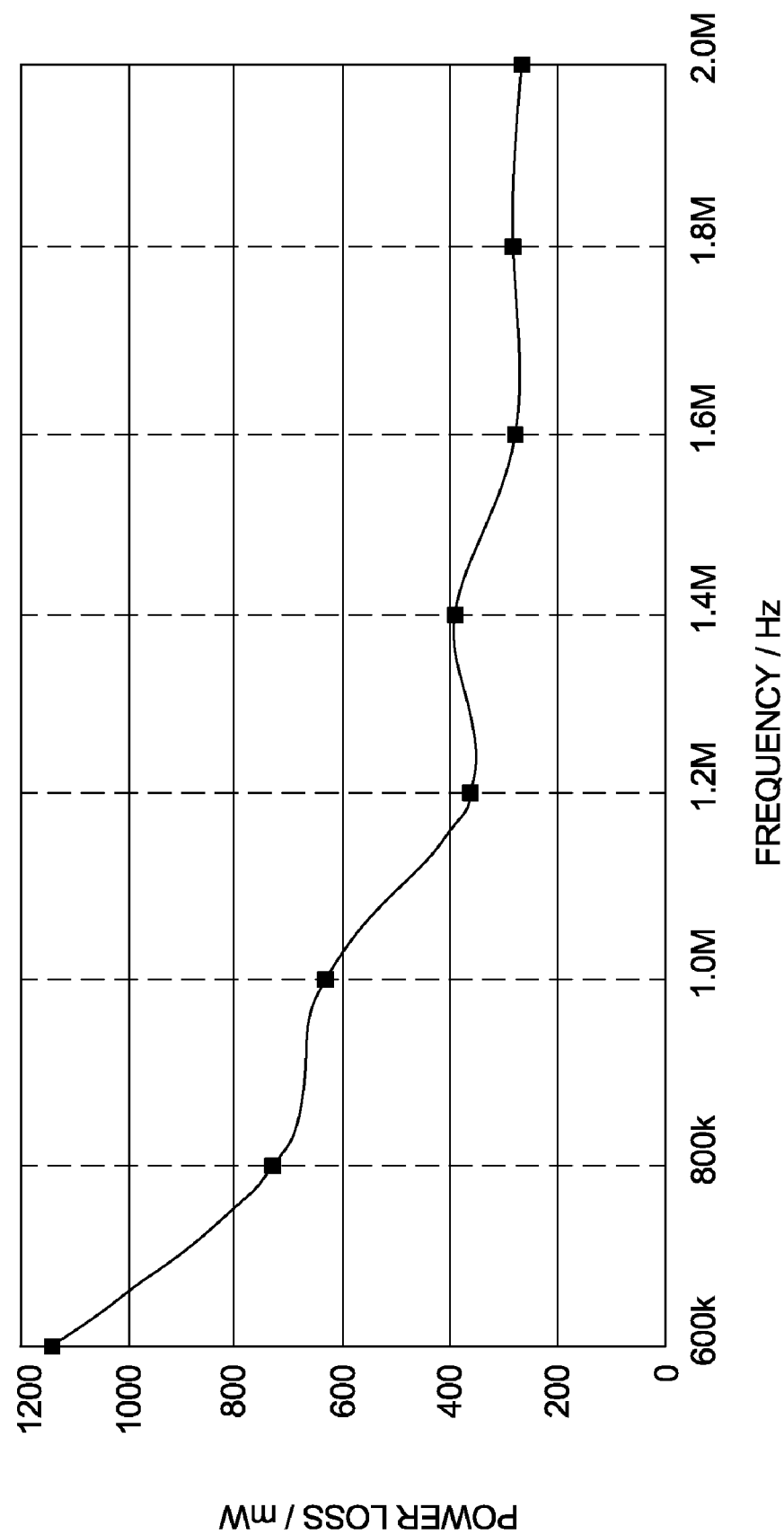
Figure 10:
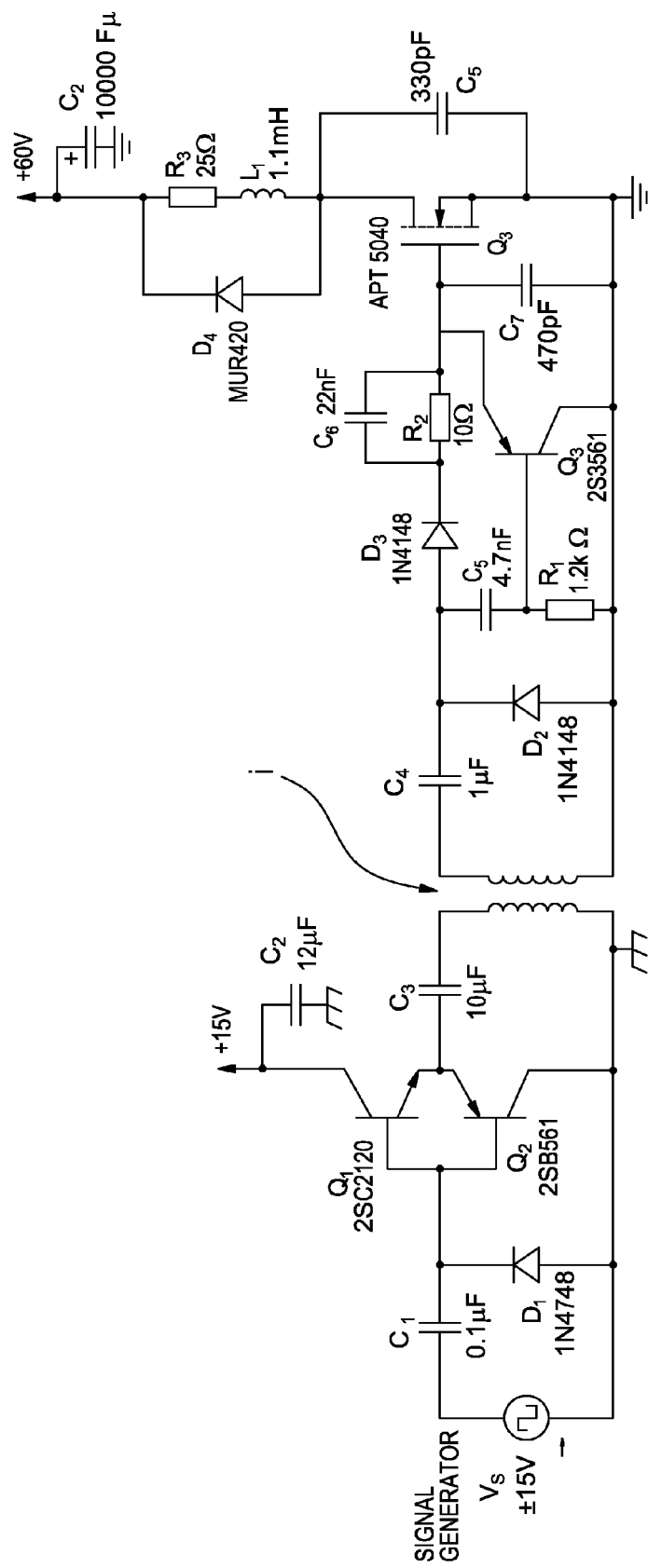
Figure 11:
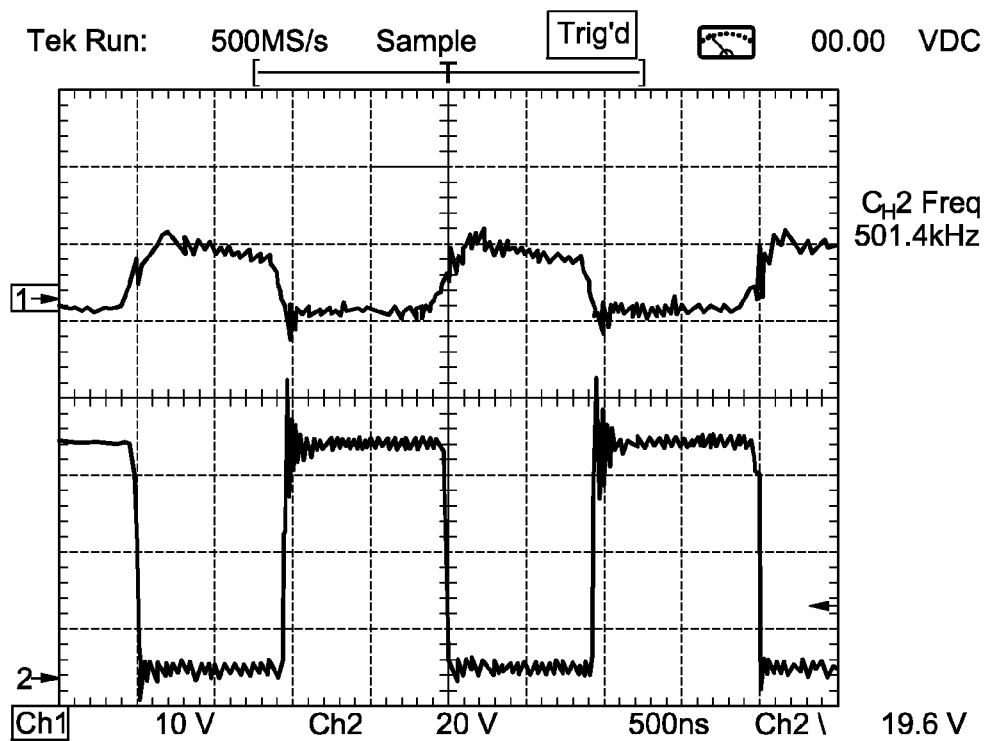
Figure 12:
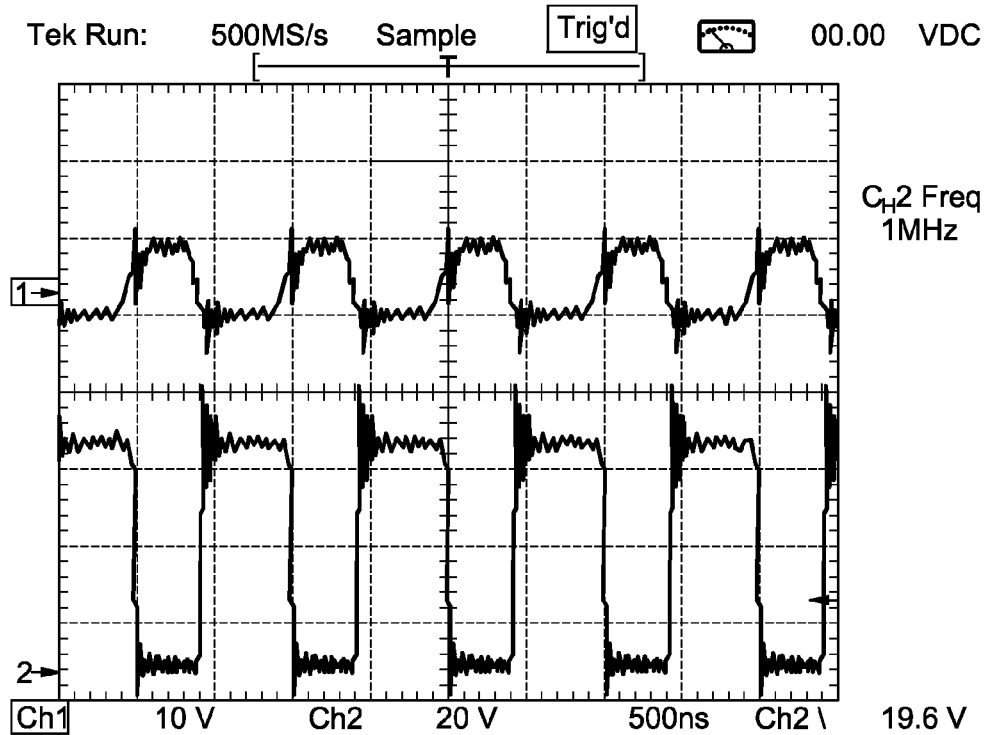
Figure 13:
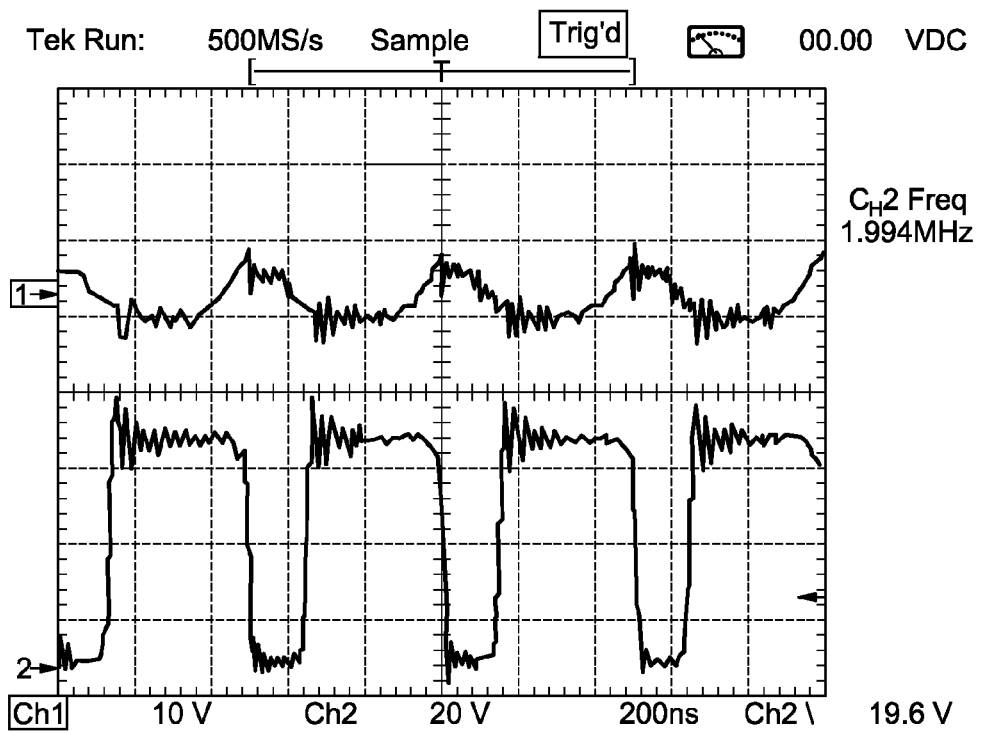
Figure 14:
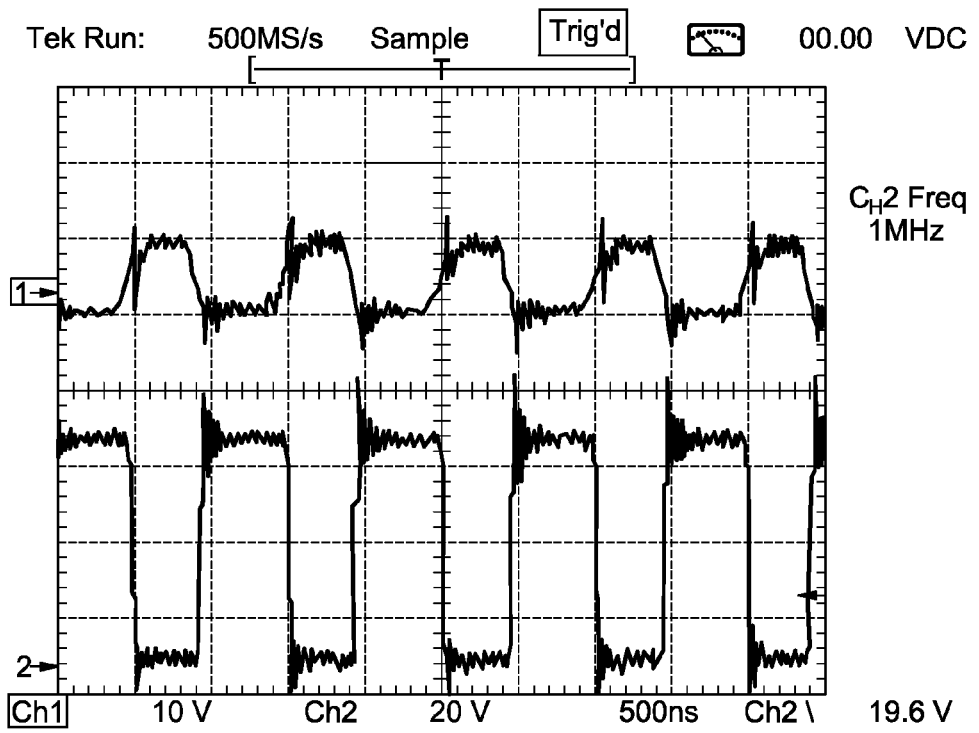
Figure 15:
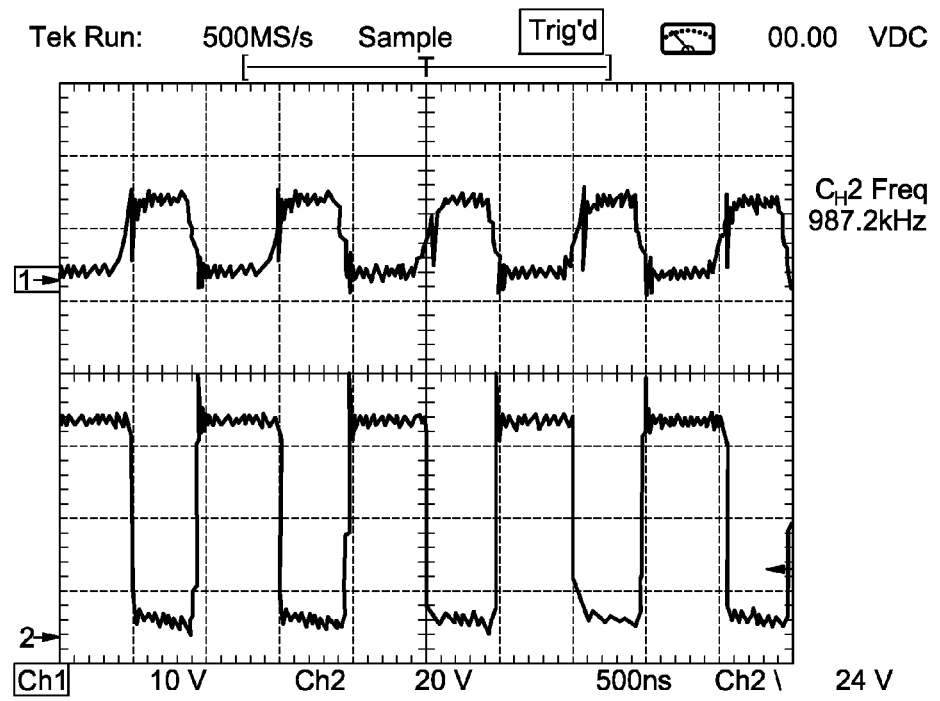
Figure 16:
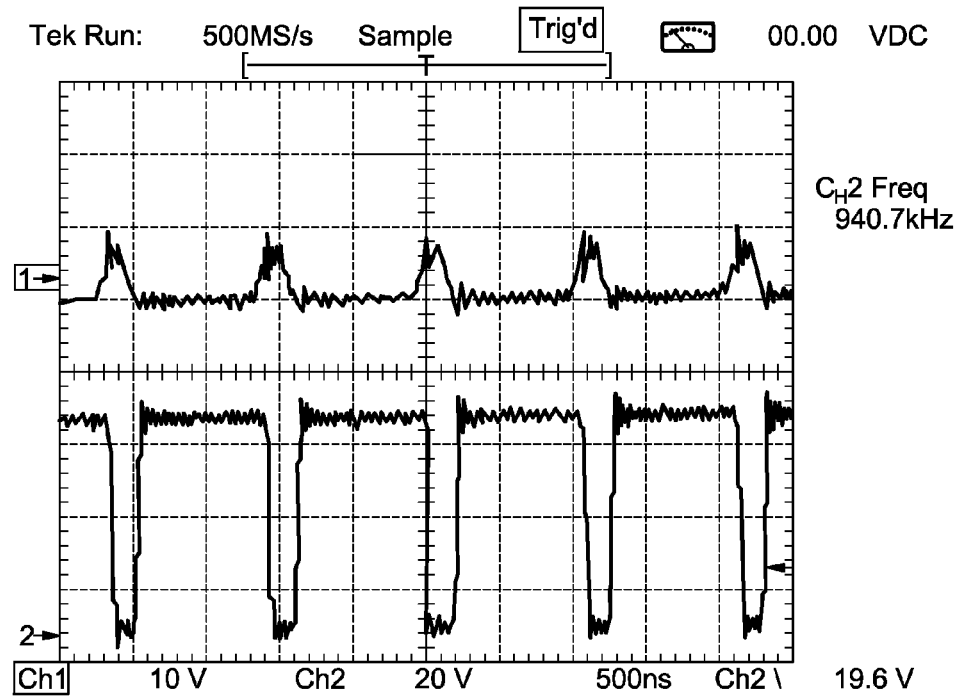
Figure 17:
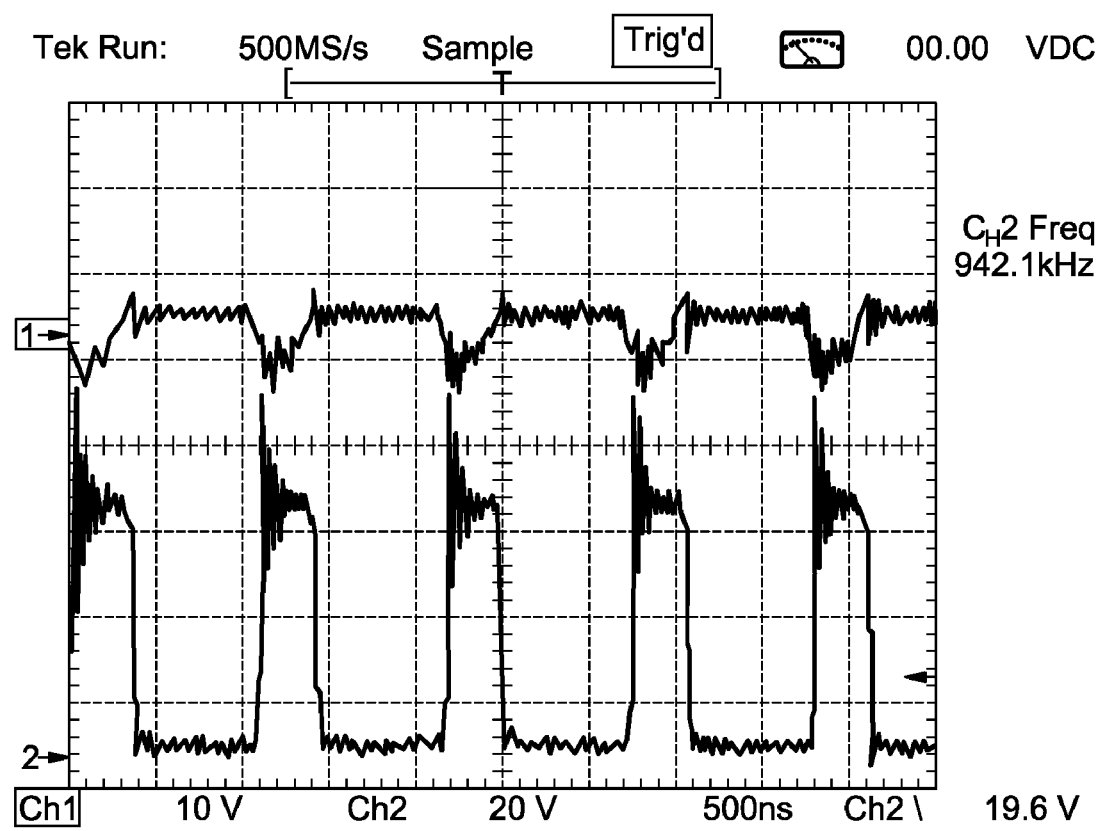
Figure 18A:
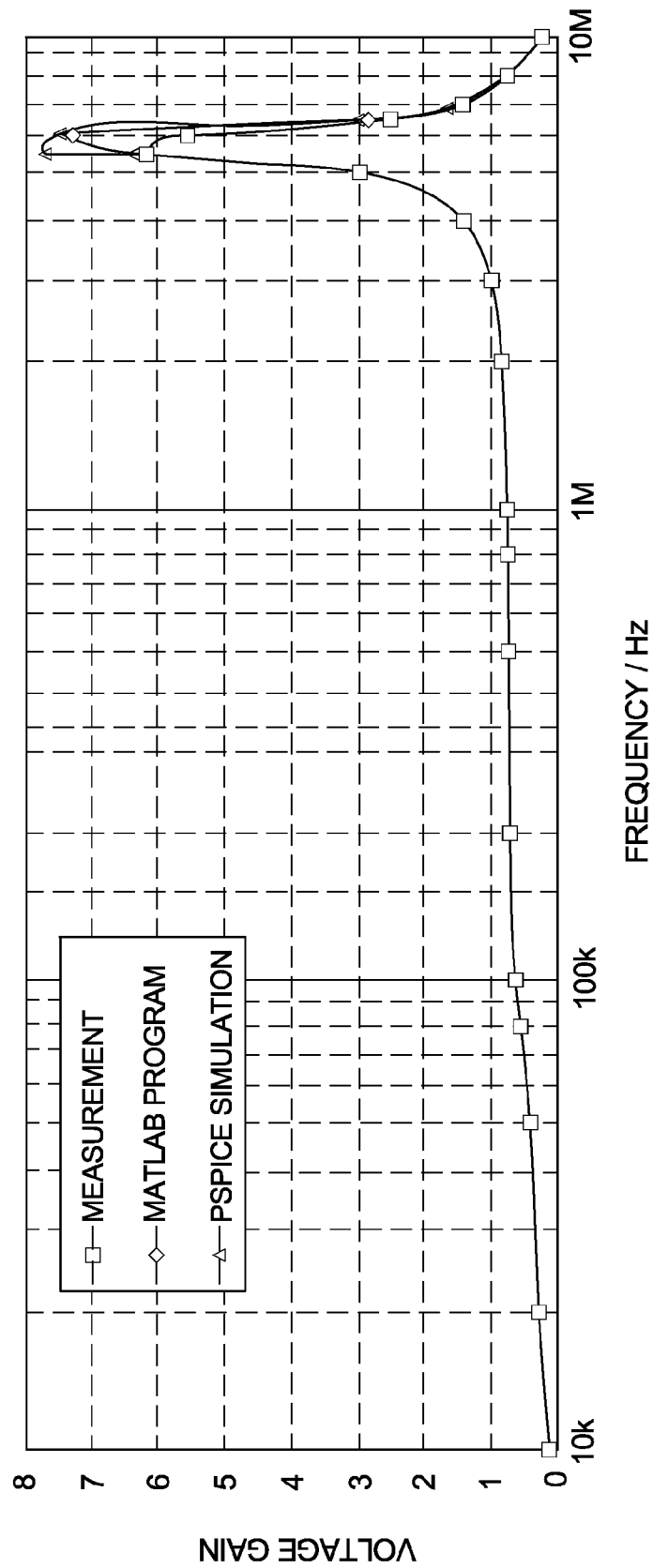
Figure 18B:
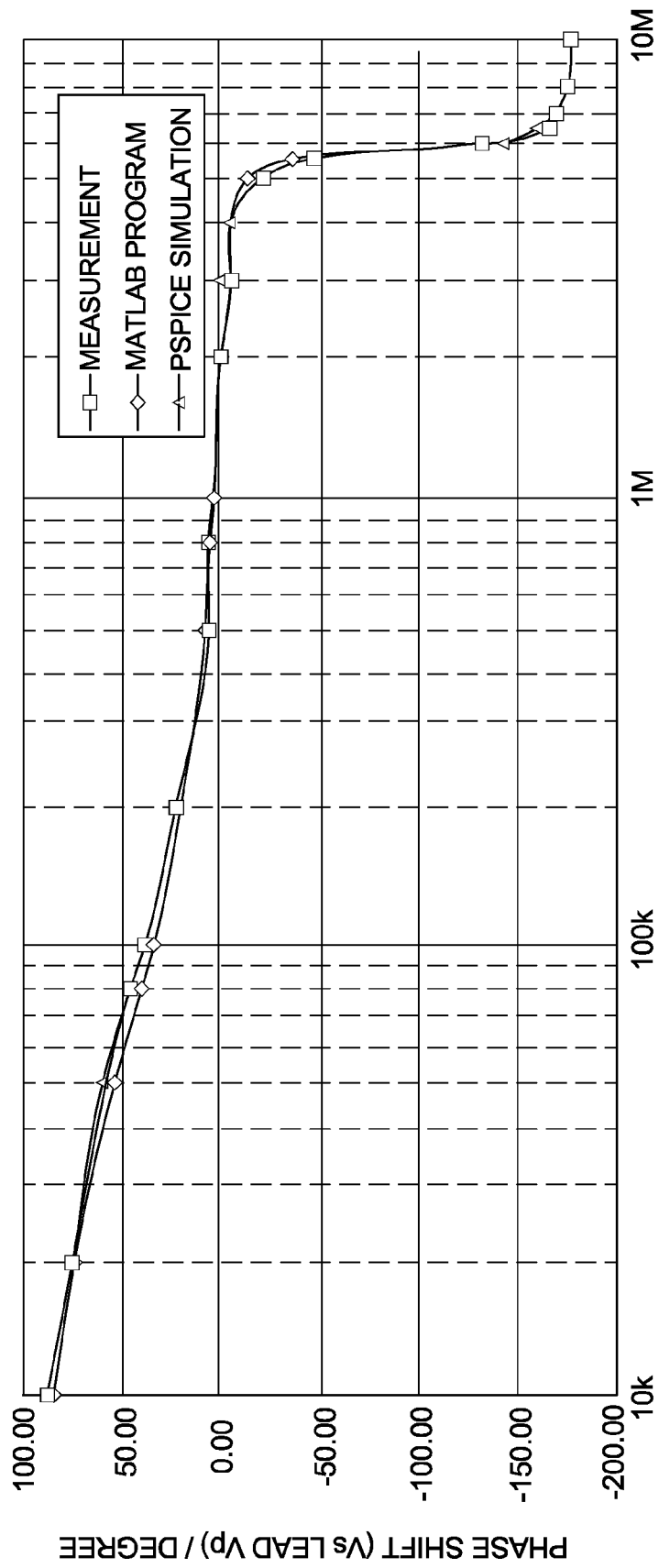
Figure 19:
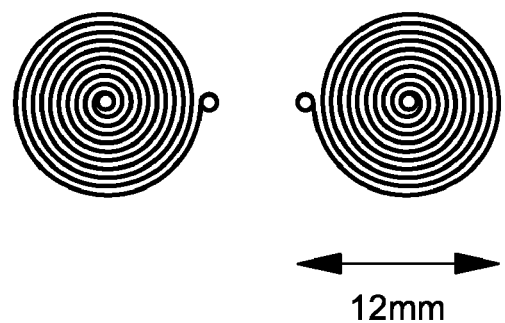
Figure 20:
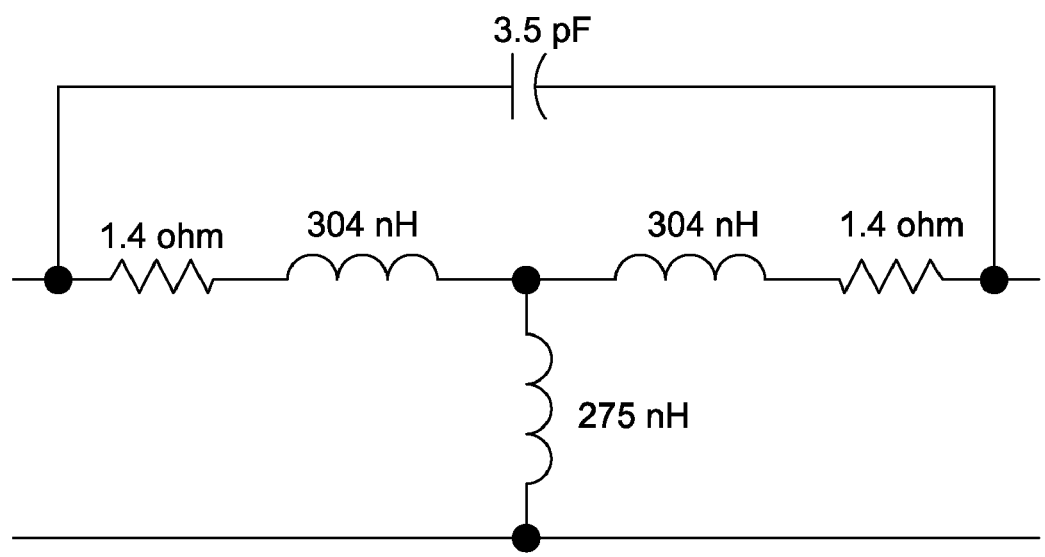
Figure 21:
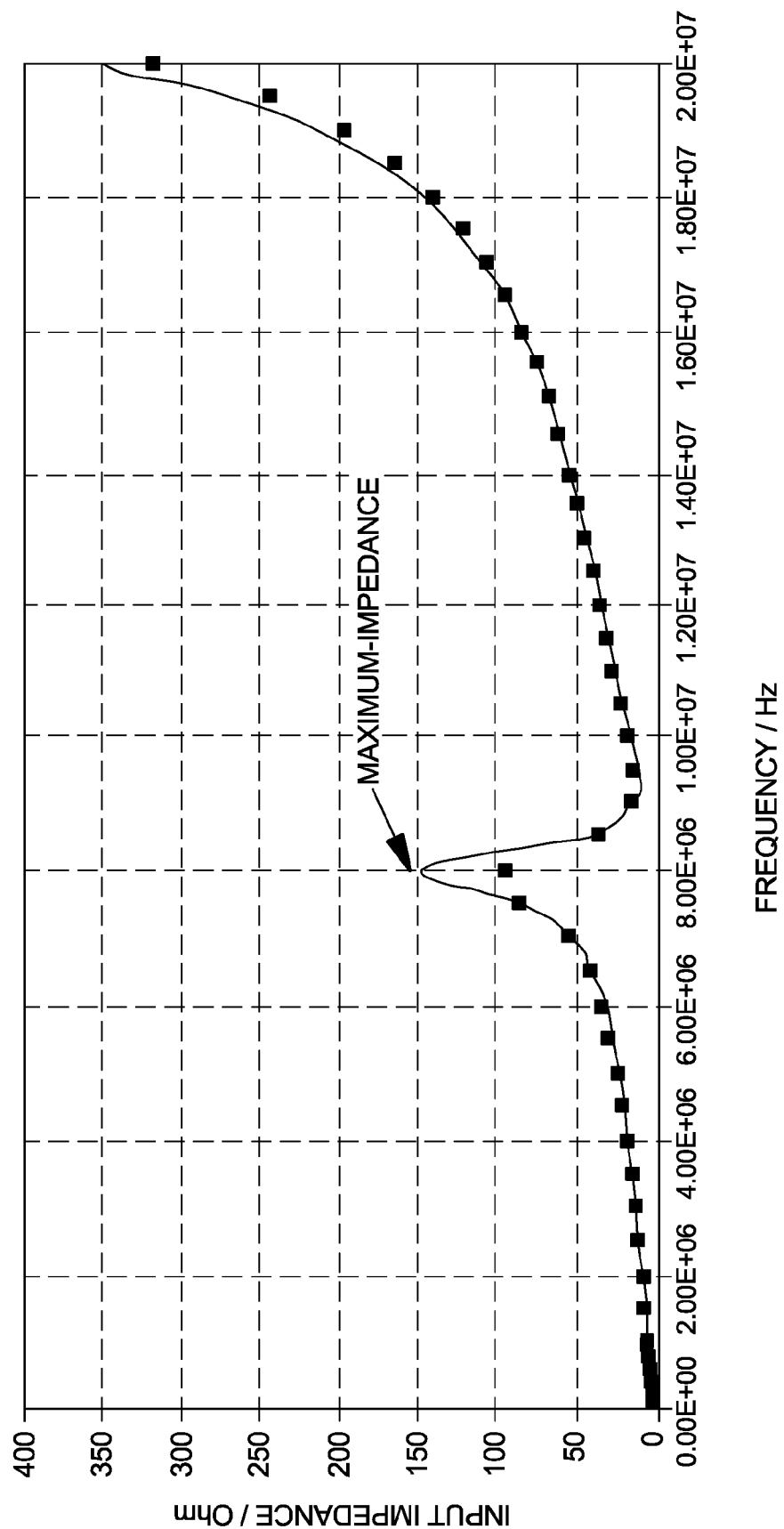
Figure 22A:
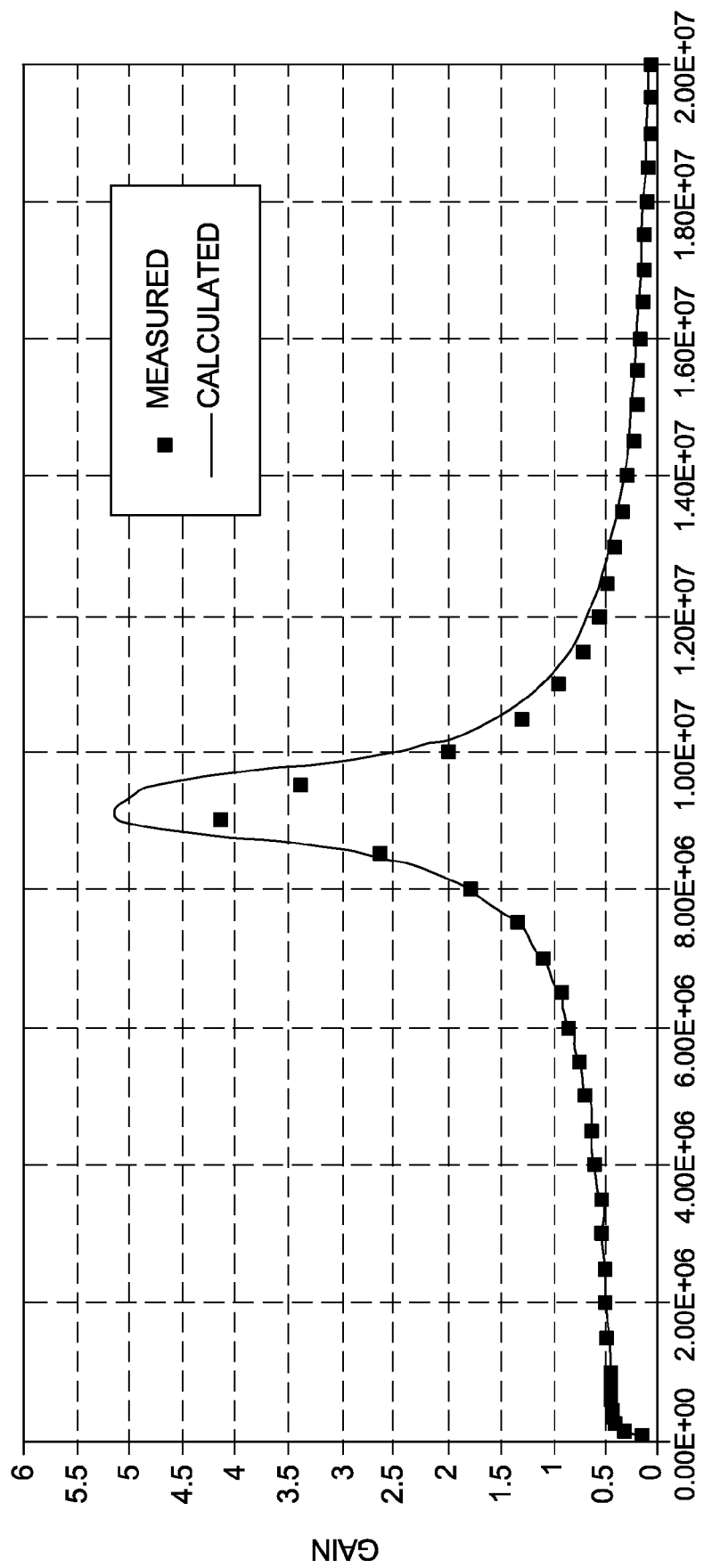
Figure 23:
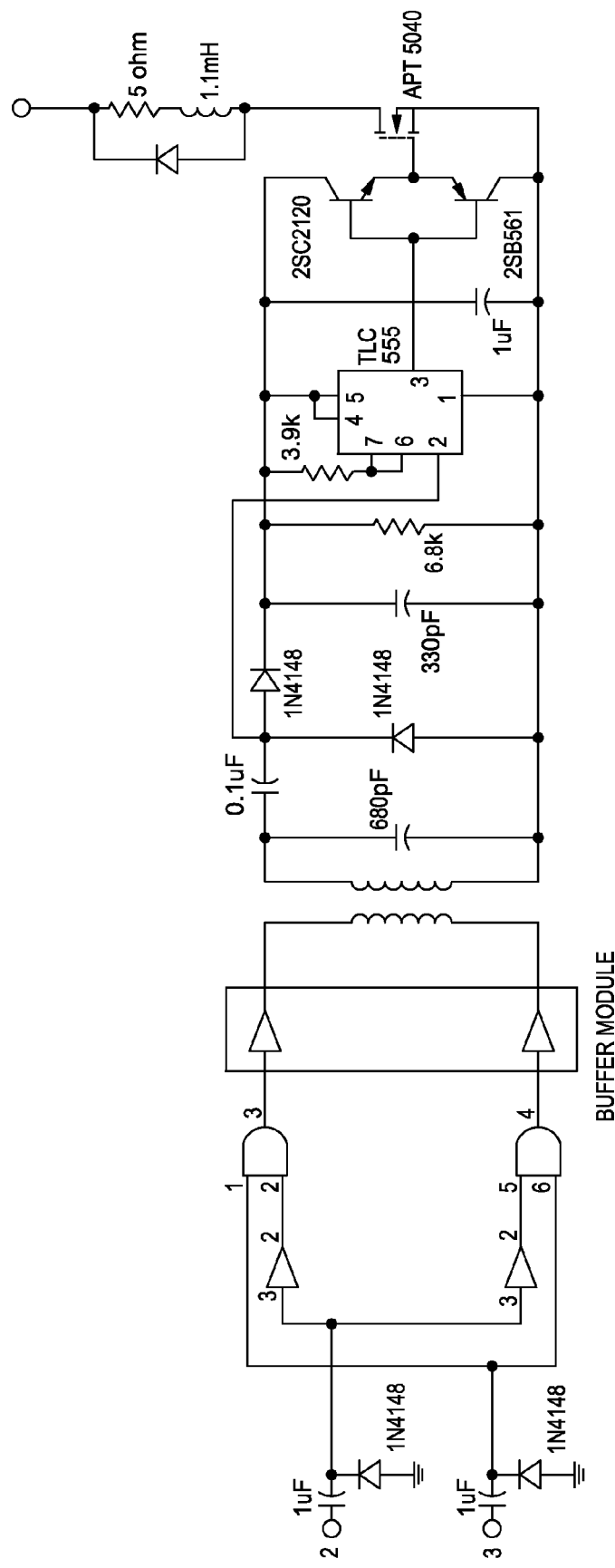
Figure 24A:
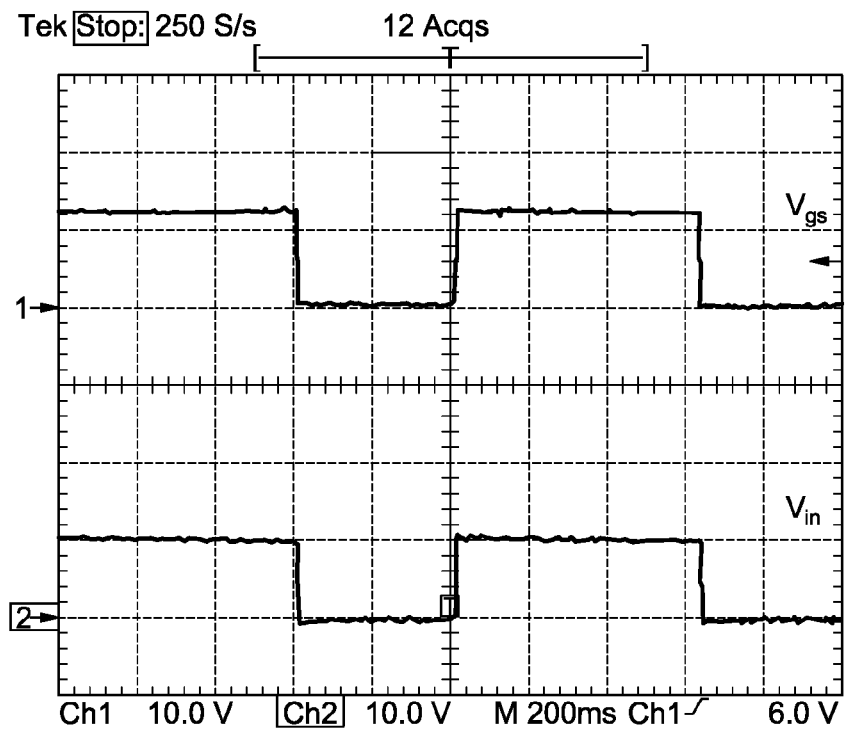
Figure 25A:
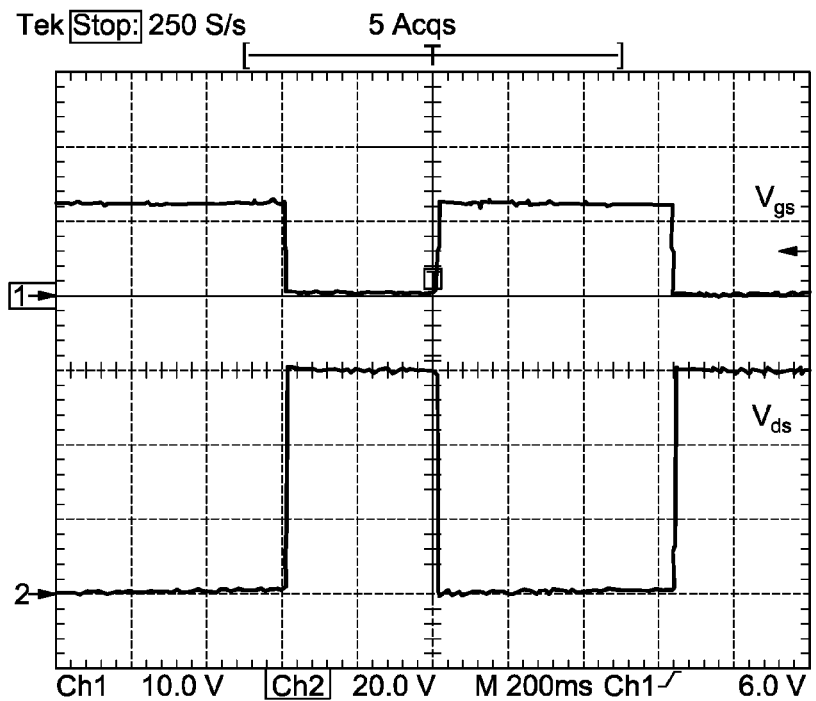
Figure 25B:
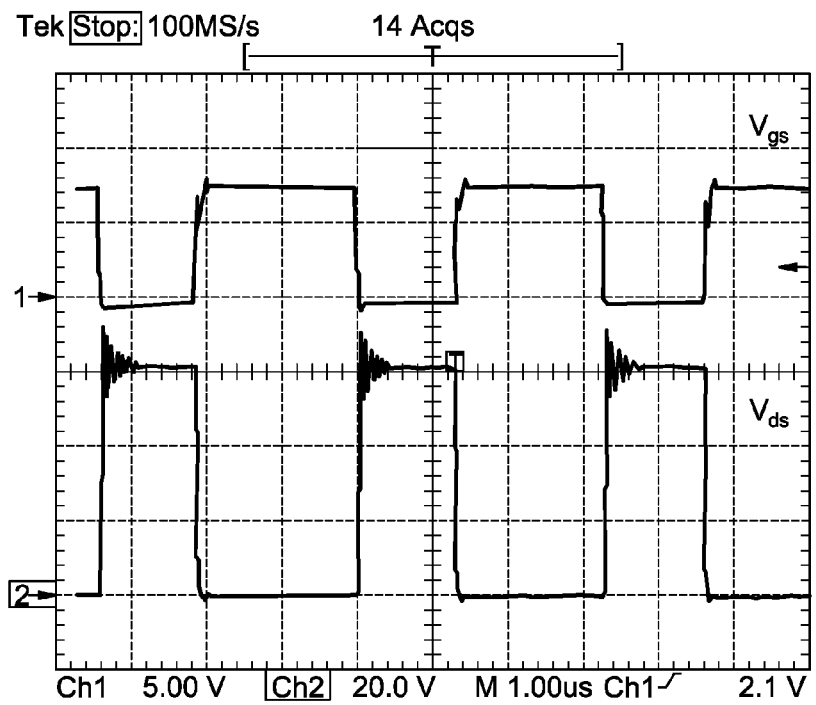
Figure 26:
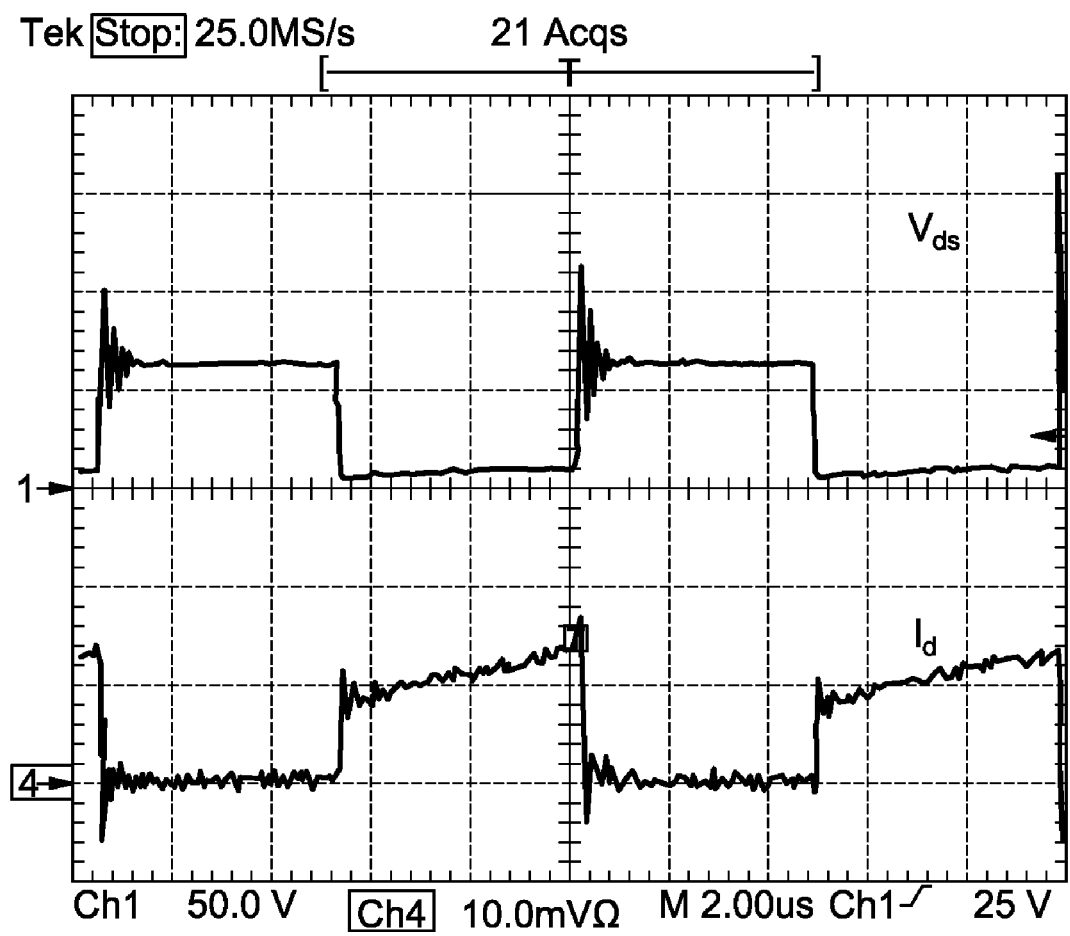
Figure 27:
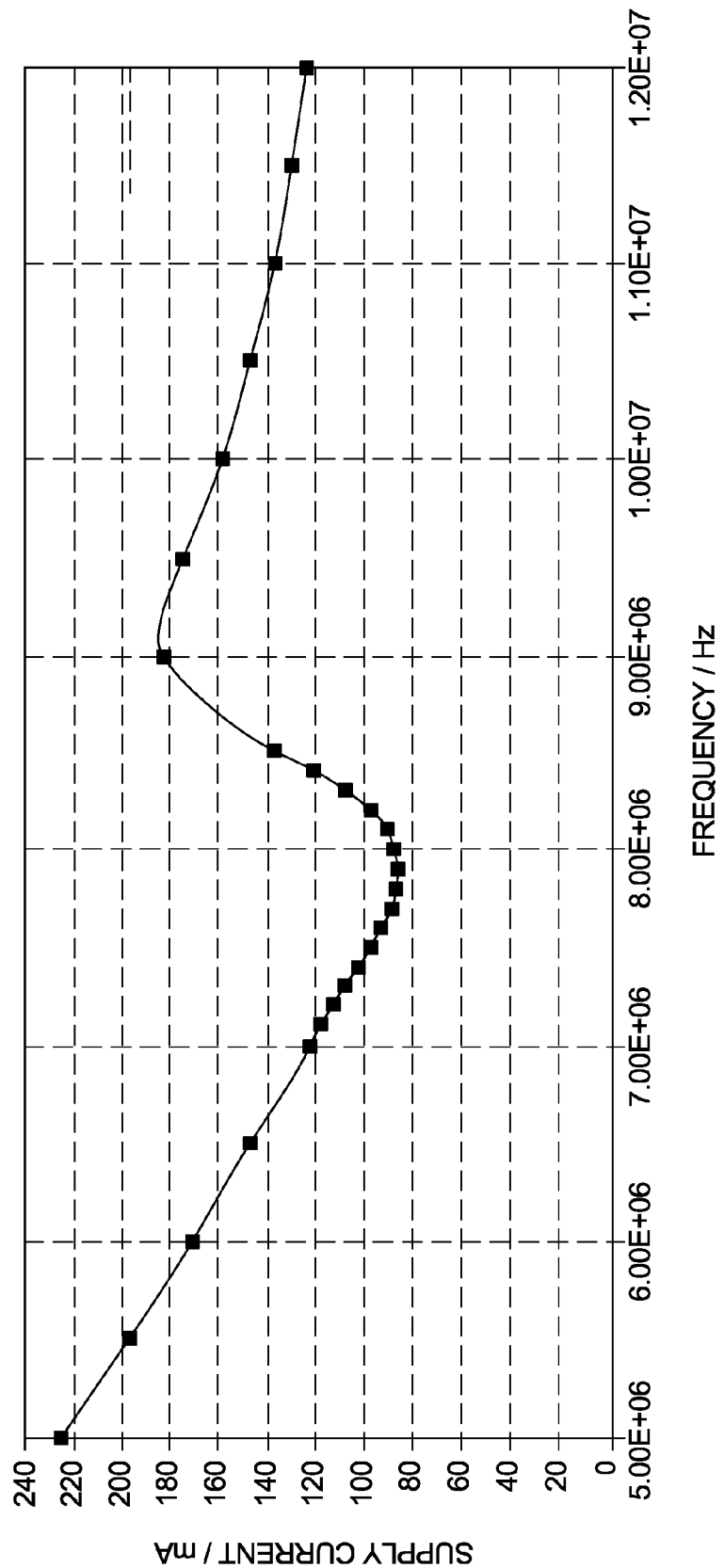
Figure 28:
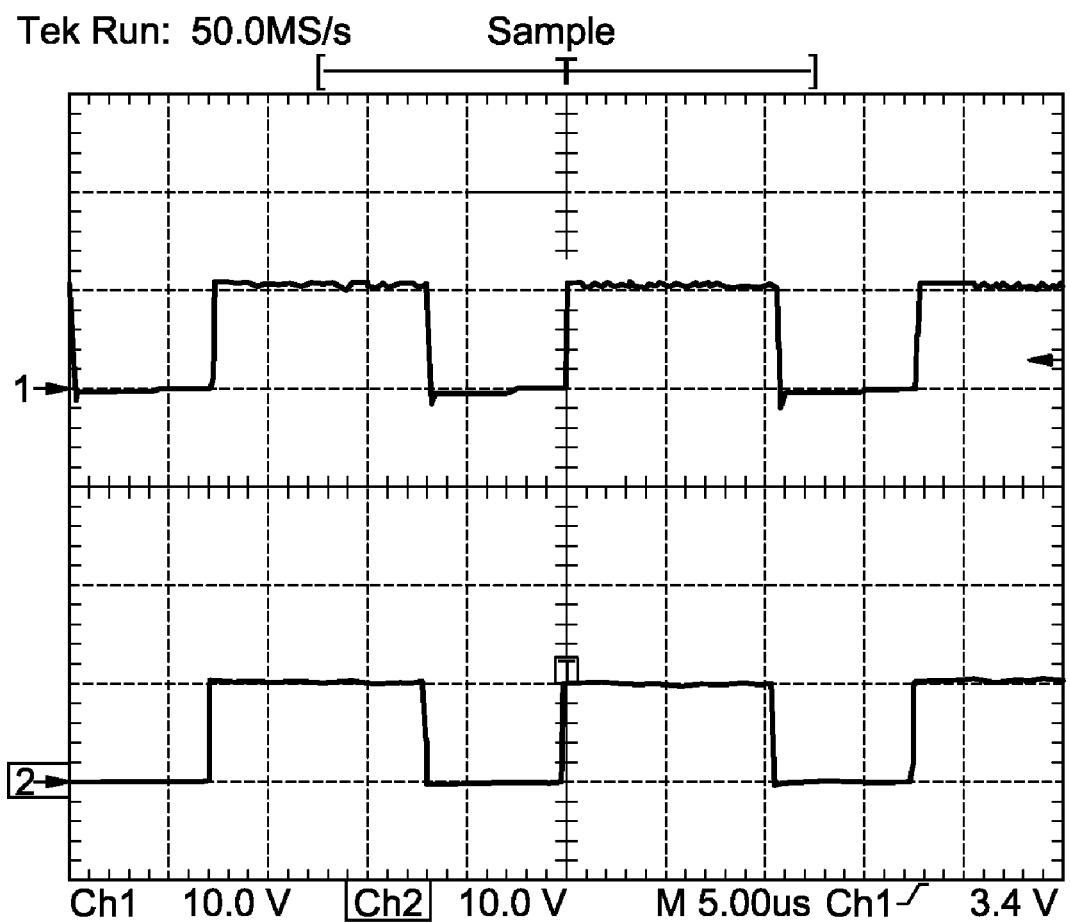
Figure 29:
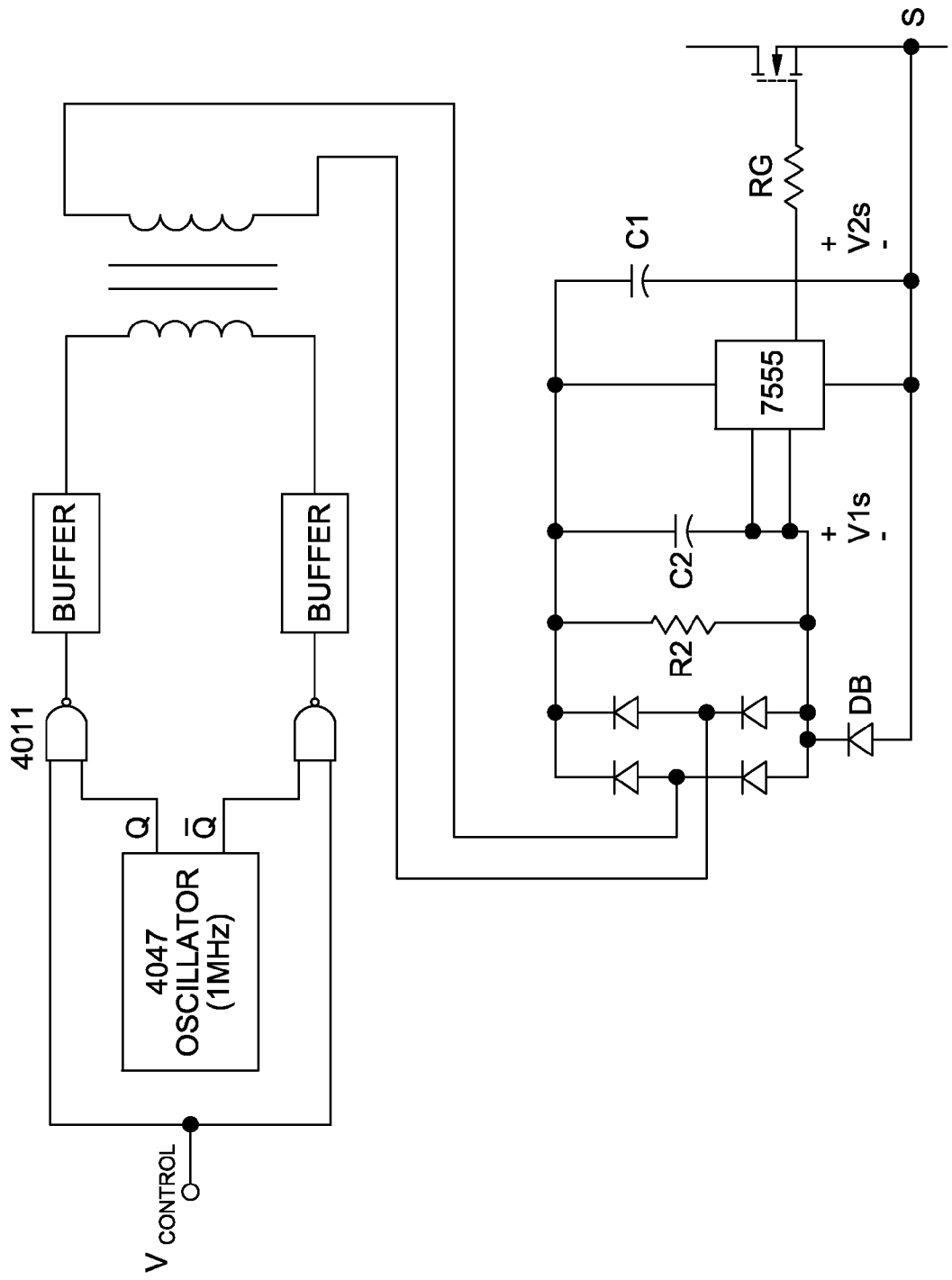
Figure 30:
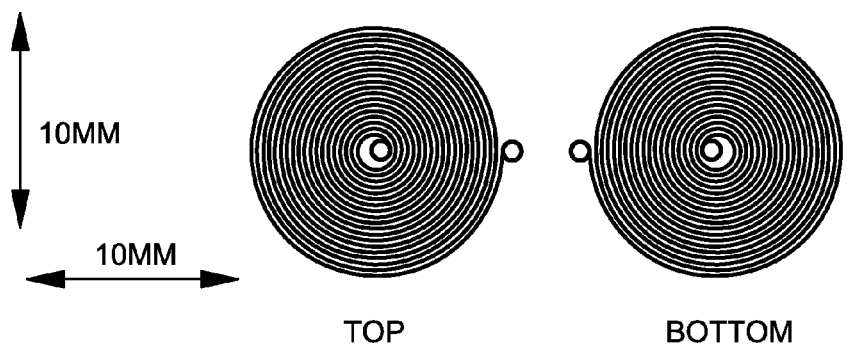
Figure 31:
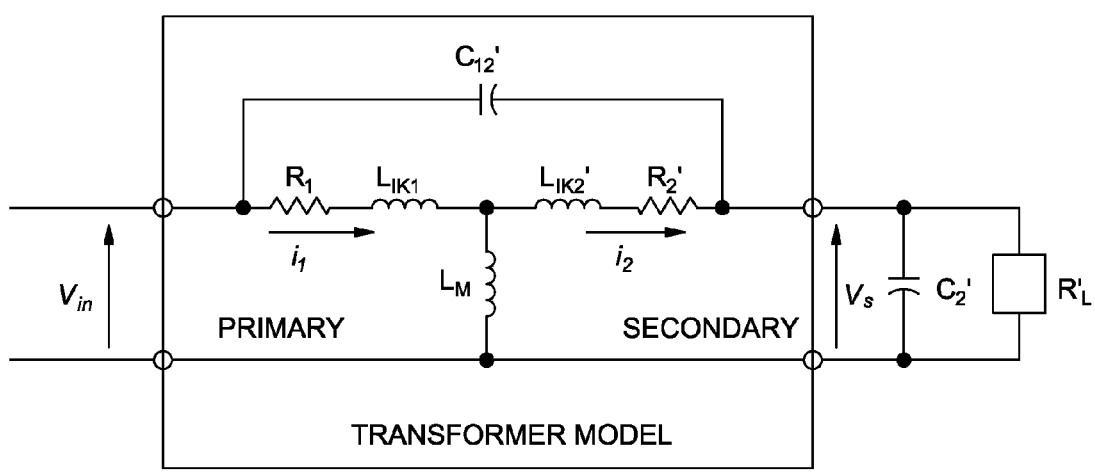
Figure 32:
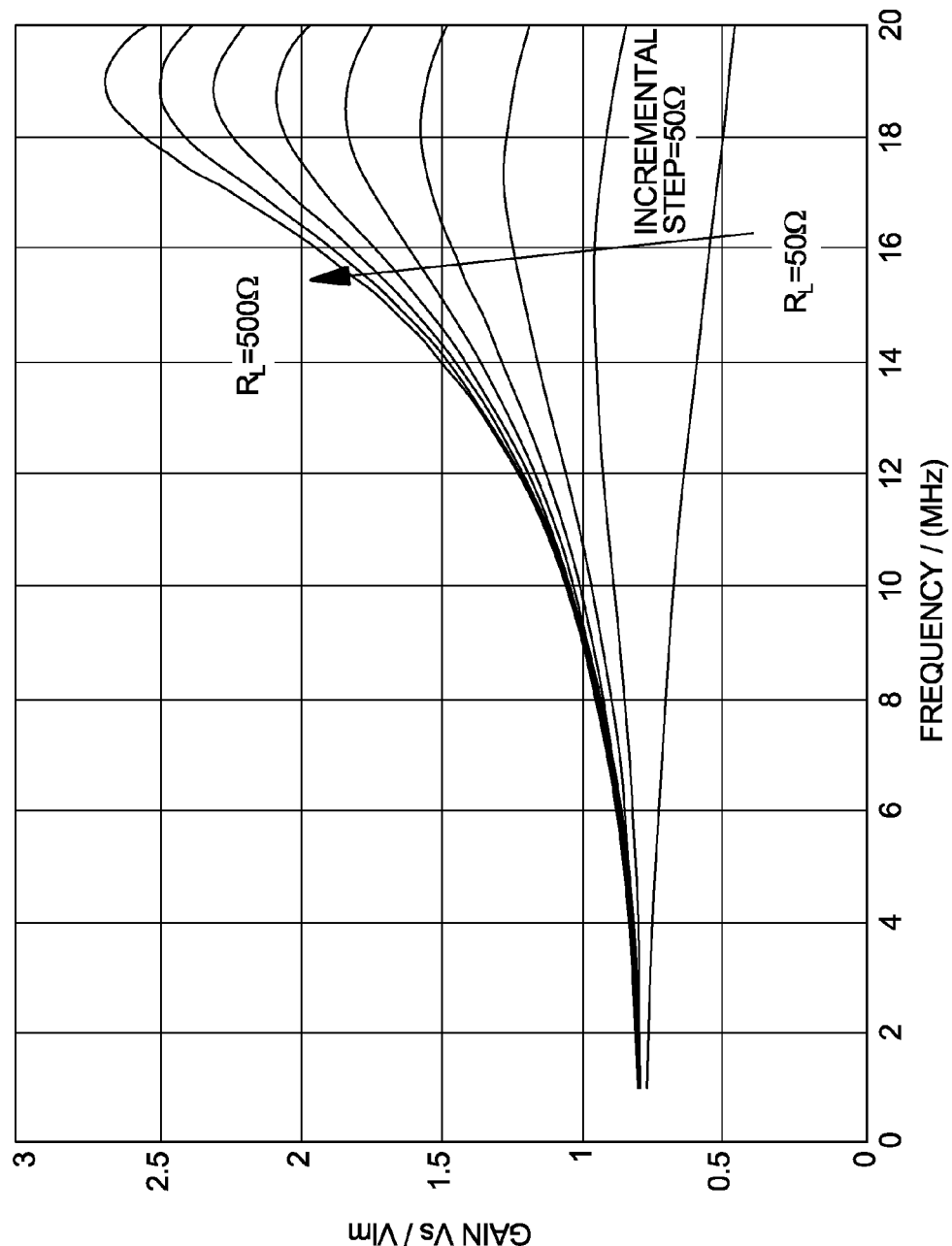
Figure 33:
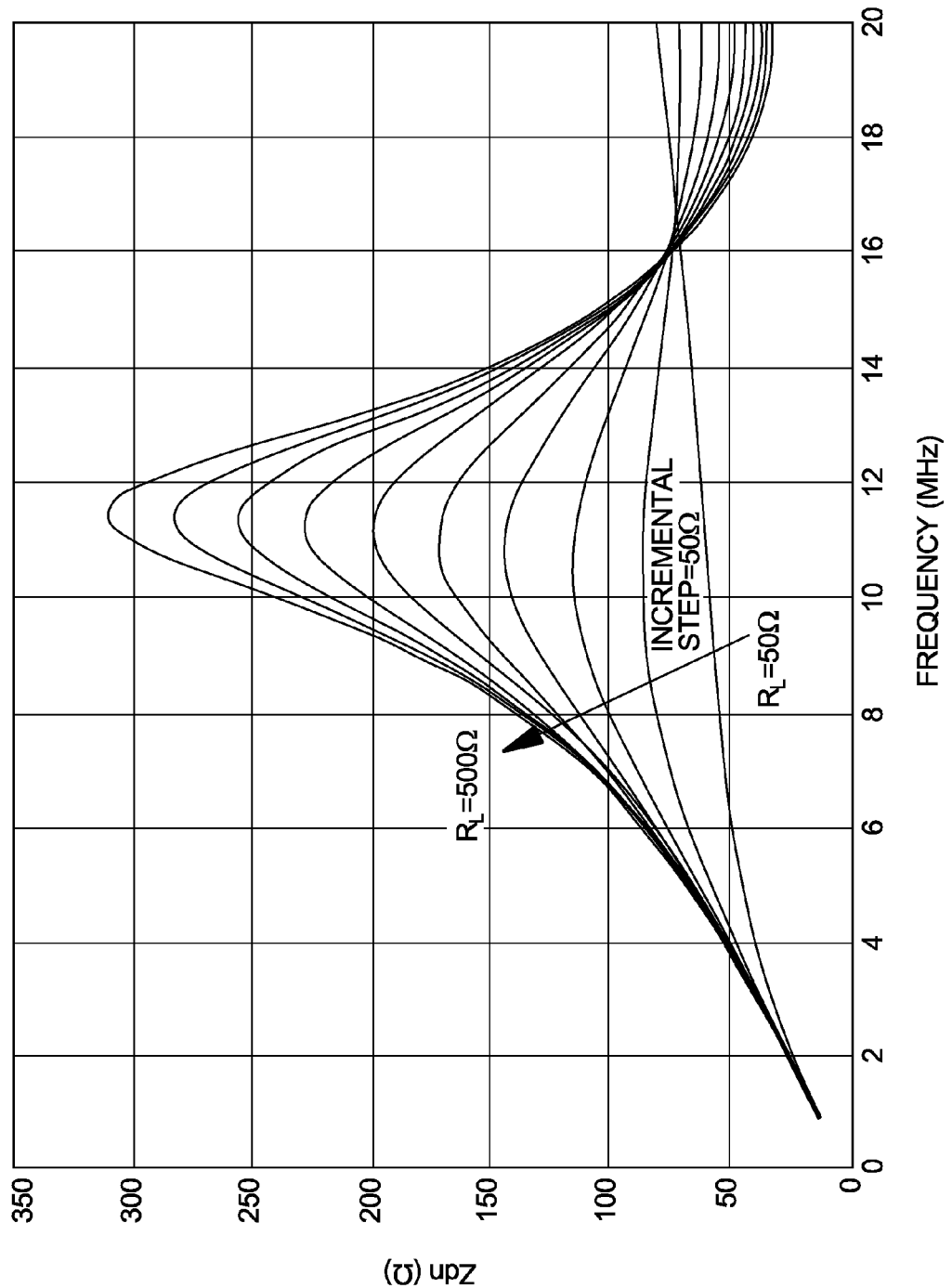
Figure 34:
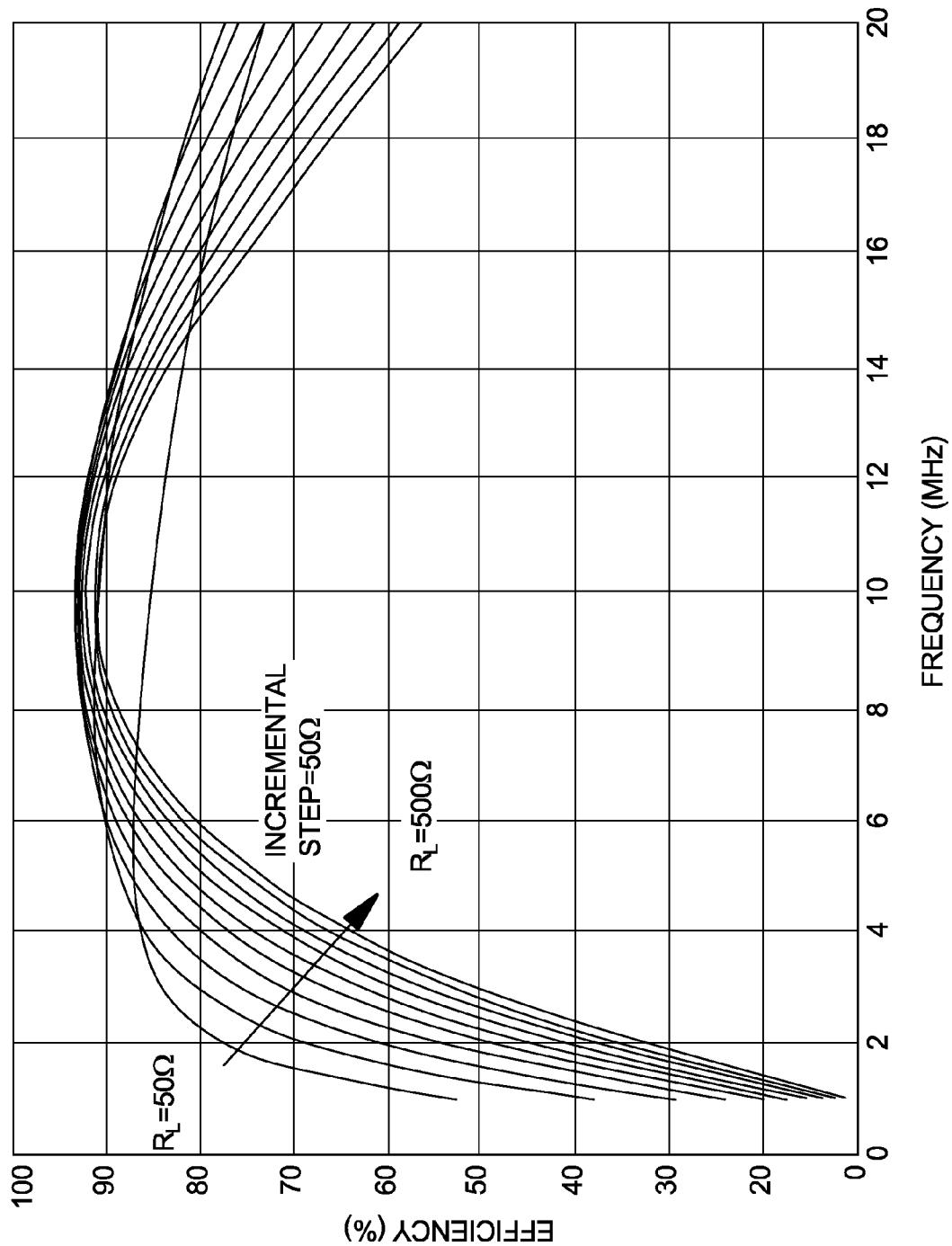
Figure 35:
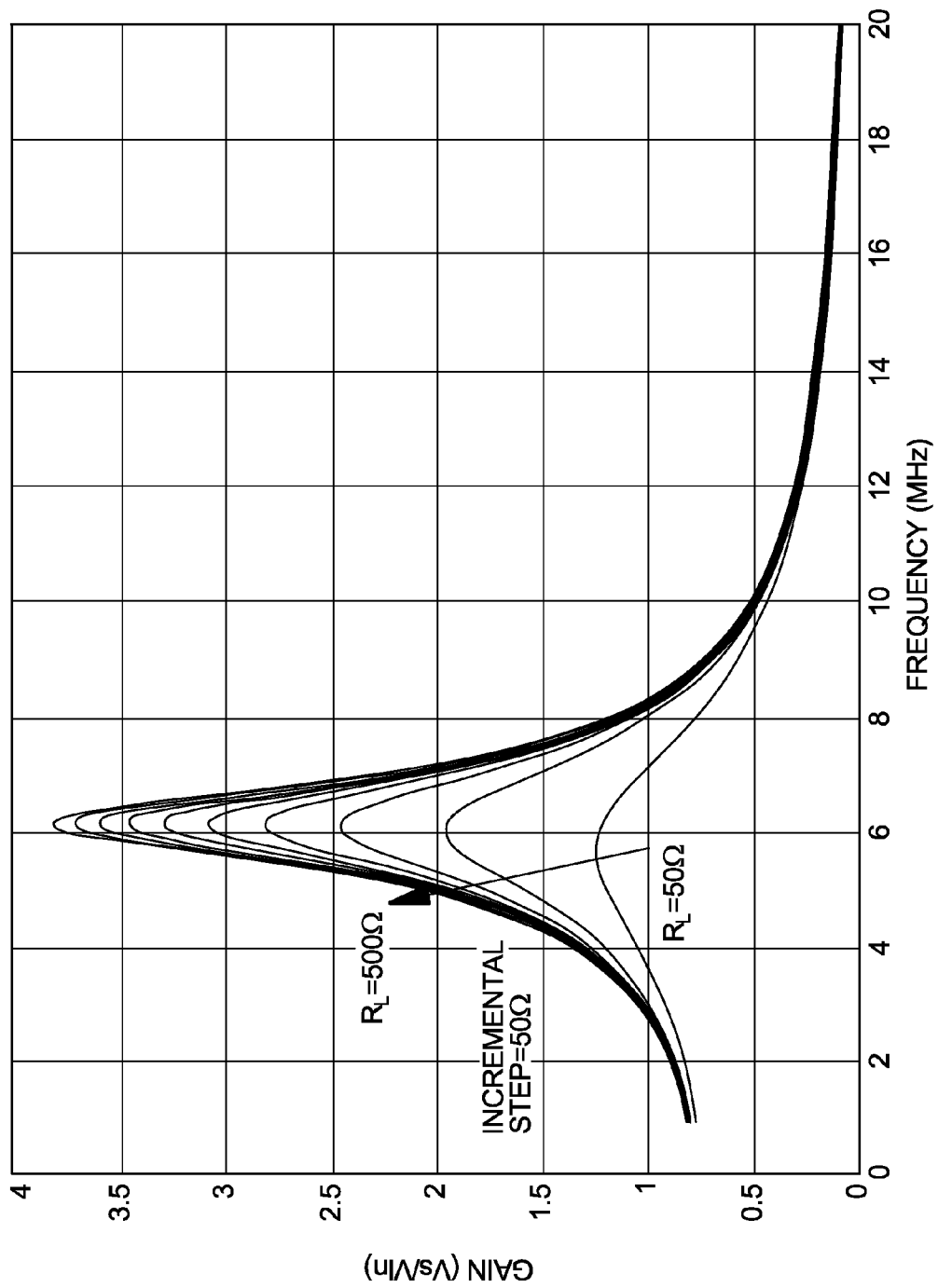
Figure 36:
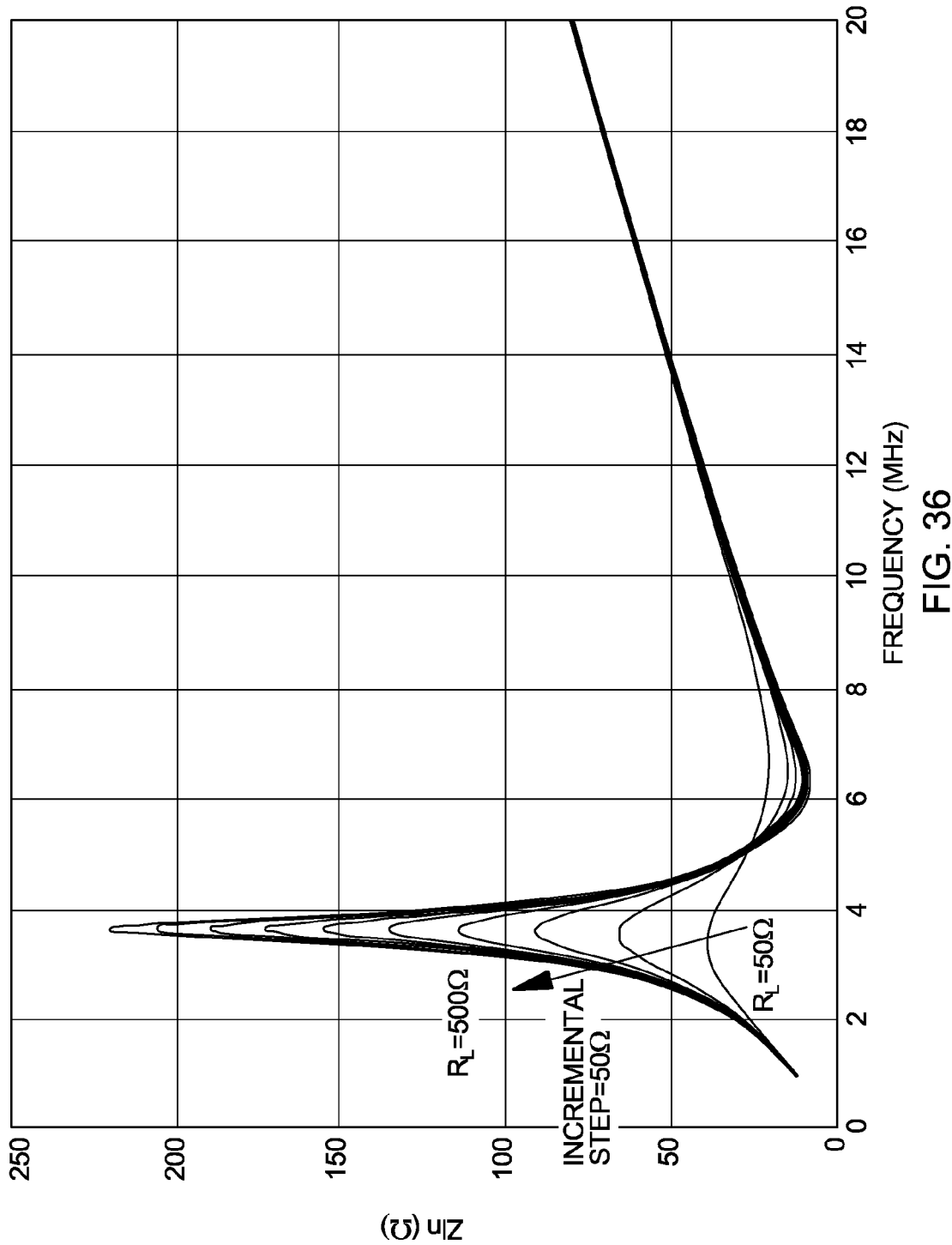
Figure 37:
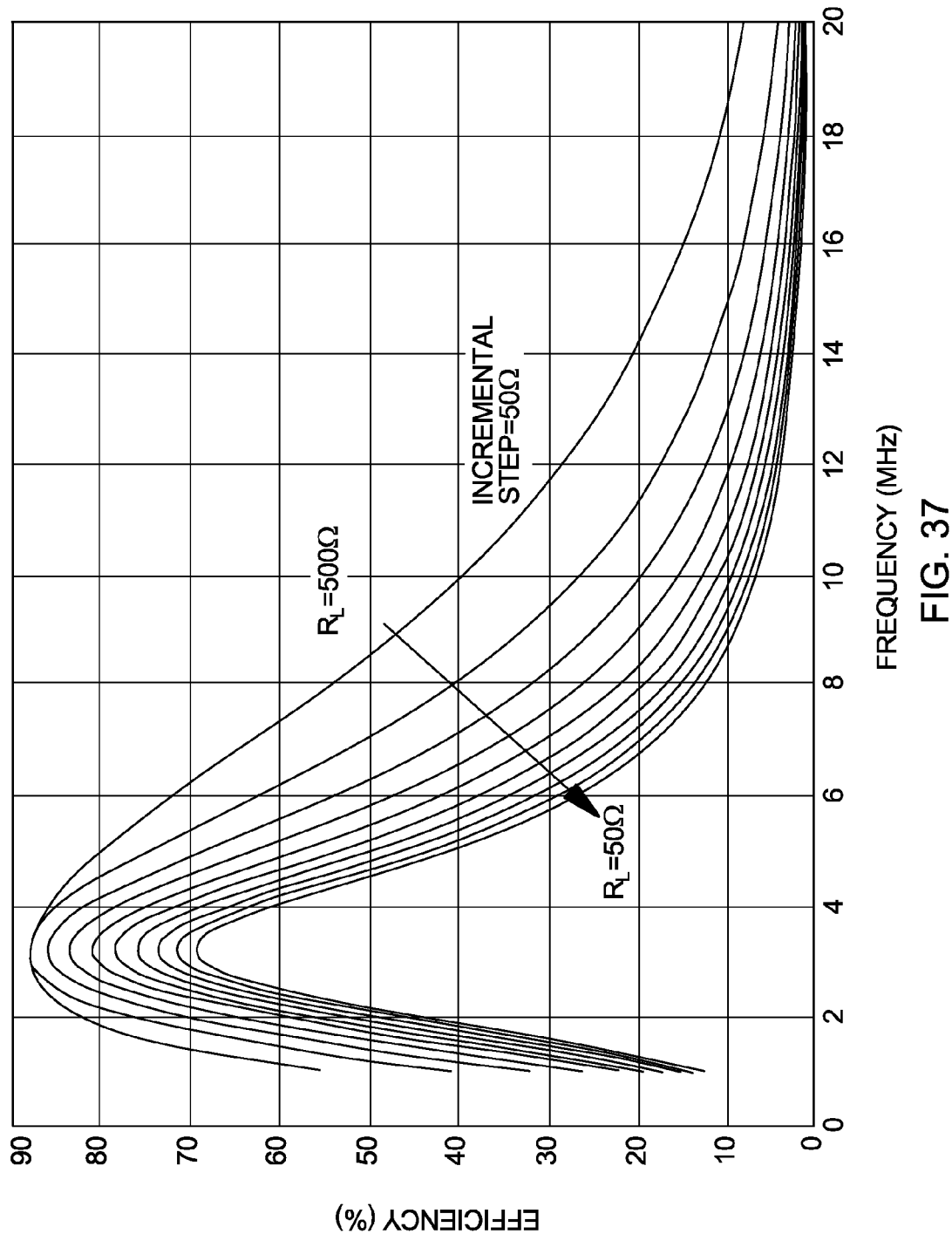

Some embodiments of the present invention will now be described by way of example and with reference to the accompanying drawings, in which:

FIGS. 1(a)-(e) illustrate five exemplary coreless PCB transformers,

FIG. 2 is a circuit diagram used for modeling a high-frequency PCB-based coreless transformer in accordance with an embodiment of the present invention, FIG. 3 is a circuit diagram equivalent to FIG. 2 but including a capacitive load, FIGS. 4(a) & (b) are plots showing calculated and measured resistances of the (a) primary and (b) secondary windings of the transformers of FIGS. 1(c)-(e), FIGS. 5(a) & (b) are plots showing the calculated (a) voltage gain and (b) phase shift of the transformers of FIGS. 1(a)-(e) with a resistive load of 1 k$\Omega$, FIGS. 6(a) & (b) are plots showing the calculated (a) voltage gain and (b) phase shift of the transformers of FIGS. 1(a)-(e) with a capacitive load, FIGS. 7(a) & (b) are plots showing the calculated, simulated, and measured (a) voltage gain and (b) phase shift for the transformer of FIG. 1(c) with a resistive load, FIGS. 8(a) & (b) are plots showing the calculated, simulated, and measured (a) voltage gain and (b) phase shift for the transformer of FIG. 1(c) with a capacitive load, FIG. 9 is a plot showing the power loss for the transformer of FIG. 1(c), FIG. 10 is a circuit diagram showing an experimental gate drive circuit used for testing transformers according to embodiments of the invention, FIG. 11 shows measured gate-source voltage (upper) and drain-source voltage (lower) waveforms of a MOSFET IRF450 at 500 kHz isolated by a transformer according to the present invention, FIG. 12 is a figure similar to FIG. 11 but at 1 MHz, FIG. 13 is a figure similar to FIGS. 11 & 12 but at 2 MHz, FIG. 14 is a figure corresponding to FIG. 12 but for a MOSFET APT5040, FIG. 15 is a figure corresponding to FIG. 12 but for a IGBT IRGPH40KD2, FIG. 16 is a figure corresponding to FIG. 12 at a duty cycle of about 10%, FIG. 17 is a figure corresponding to FIG. 16 but at a duty cycle of about 80%, FIGS. 18(a) and (b) are plots showing measured, calculated and simulated results for the (a) voltage gain, and (b) phase shift as a function of frequency for the transformer of FIG. 1(c), FIG. 19 shows a further embodiment of a transformer according to the present invention, FIG. 20 is a circuit-diagram for a high-frequency equivalent model to the transformer of FIG. 19, FIG. 21 are plots showing the predicted (solid line) and measured (dotted line) values of input impedance against operating frequency for the transformer of FIG. 19 (with a capacitive and a resistive load), FIGS. 22(a) and (b) are plots of the predicted (solid line) and measured (dotted line) for (a) the voltage gain and (b) the phase shift as a function of frequency for the transformer of FIG. 19 (with a capacitive and resistive load), FIG. 23 is a circuit diagram showing a modulated gate drive using the transformer of FIG. 19, FIGS. 24(a) and (b) are plots showing (a) the input and output signals of the gate drive circuit of FIG. 23 at an operating frequency of 1 Hz, and (b) the input ($V_{in}$), the voltage across the primary winding ($V_c$) and the output signal ($V_{gs}$) of the gate driving circuit of FIG. 23 at an operating frequency of 300 kHz, FIGS. 25 (a) and (b) are plots showing the gate-source voltage (upper) and drain-source voltage (lower) of a power MOSFET driven by the circuit of FIG. 23 at an operating frequency of (a) 1 Hz and (b) 300 kHz, FIG. 26 are plots showing the gate-source voltage (upper) and drain current (lower) of a power MOSFET driven by the circuit of FIG. 23 at an operating frequency of 100 kHz, FIG. 27 is a plot showing the measured input current of the gate drive circuit of FIG. 23 against carrier frequency under a duty cycle of 1.0, FIG. 28 is a plot showing an input (lower trace) and an output (upper trace) when a digital signal is applied at a conventional modem data transmission frequency, FIG. 29 is a circuit diagram of a modulated gate drive circuit with smooth duty cycle transition from 0 to 1 known from the prior art, FIG. 30 shows the primary and secondary windings of another coreless PCB-based transformer, FIG. 31 shows the equivalent circuit of the transformer of FIG. 30 (with a capacitive and resistive load), FIG. 32 is a plot of the gain of the transformer of FIG. 30 against operating frequency with $C_2$=100 pF, FIG. 33 is a plot of the input impedance of the coreless PCB-based transformer of FIG. 30 against operating frequency with $C_2$=100 pF, FIG. 34 is a plot of the energy efficiency of the transformer of FIG. 30 against operating frequency with $C_2$=100 pF, FIG. 35 is a plot of the gain of the transformer of FIG. 30 against operating frequency with $C_2$=1000 pF, FIG. 36 is a plot of the input impedance of the transformer of FIG. 30 against operating frequency with $C_2$=1000 pF, and FIG. 37 is a plot of the energy efficiency of the transformer of FIG. 30 against operating frequency with $C_2$=1000 pF.

FIGS. 1(a)-(e) illustrate five transformers in accordance with embodiments of the invention. Each figure shows the primary and secondary "windings" side by side. In practice, of course, the primary and secondary windings are deposited by conventional PCB techniques on top and bottom sides of a PCB of a thickness of 1.54 mm. The primary and secondary windings are laid directly on opposite sides of the double-sided PCB in order to minimise the leakage inductances. The transformers of FIGS. 1(a)-(d) have 10 turns in the primary winding and 12 in the secondary winding. The additional two turns in the secondary winding are to compensate for the voltage drop. The transformer of FIG. 1(e) has 10 primary turns and 18 secondary turns. The dimensions of the transformers are schematically indicated in the Figures. The transformer of FIG. 1(a) corresponds to that of Bourgeois but with the ferrite core removed.

All five transformers of FIGS. 1(a)-(e) are capable of driving power devices. In practical terms, however, the transformers of FIGS. 1(c)-(e) are potentially of greater interest because of their smaller size. In the following particular attention will be made to the transformers of FIGS. 1(c)-(e), but results from FIGS. 1(a) & (b) will also be referred to for confirmation of simulation results and analysis.

To simulate the performance of the transformers of the present invention a model must be developed, and since the transformers are intended for high-frequency operation the leakage inductances and distributed capacitances across and between the windings must be included, but as no core is used the core loss resistance in traditional low-frequency modeling may be ignored. A model for a high-frequency PCB-based coreless transformer is shown in FIG. 2 where:

$R_1$ is the primary winding resistance
$R'_2$ is the secondary winding resistance referred to the primary side
$R_L$ is the resistive load
$L_{lk1}$ is the primary leakage inductance
$L'_{lk2}$ is the secondary leakage inductance referred to the primary side
$L_{M1}$ is the primary mutual inductance
$C'_1$ is the primary inter-winding capacitance referred to the primary side
$C'_2$ is the secondary inter-winding capacitance referred to the primary side
$C'_{12}$ is the capacitance between the primary and secondary windings referred to the primary side, and
n is the turn ratio.

Based on this circuit model the transfer function of the PCB-based transformers of the present invention may be calculated by the following Eqs. (1)-(3) and is shown in Eq. (4). The transfer function is in fact evaluated under a loaded condition, and as will be shown below the load condition affects the frequency response of the transformer and thus places a potential limit on the maximum operating frequency of the gate drive circuits.

$$-\frac{1}{R_1 + sL_{lk1}}V_p + \left(\frac{1}{R_1 + sL_{lk1}} + \frac{1}{sL_{M1}} + \frac{1}{R'_2 + sL'_{lk2}}\right)V_1 - \frac{1}{R'_2 + sL'_{lk2}}nV_s = 0 \quad (1)$$

At node 2

$$-sC_{12}V_p - \frac{1}{R'_2 + sL'_{lk2}}V_1 + \left(\frac{1}{R'_2 + sL'_{lk2}} + sC_{12} + sC_2 + \frac{1}{n^2 R_L}\right)nV_s = 0 \quad (2)$$

From (2), $$V_1 = (R'_2 + sL'_{lk2})\left[-sC'_{12}V_p + \left(\frac{1}{R'_2 + sL'_{lk2}} + sC'_{12} + sC'_2 + \frac{1}{n^2 R_L}\right)nV_s\right] \quad (3)$$

From (1) and (3)

$$\frac{V_s}{V_p} = \frac{1}{n} \frac{\frac{1}{R_1 + sL_{lk1}} + sC_{12}\left[(R'_2 + sL'_{lk2})\left(\frac{1}{R_1 + sL_{lk1}} + \frac{1}{sL_{M1}}\right) + 1\right]}{-\frac{1}{R'_2 + sL'_{lk2}} + \left(\frac{1}{R'_2 + sL'_{lk2}} + sC_{12} + sC_2 + \frac{1}{n^2 R_L}\right)\left[(R'_2 + sL'_{lk2})\left(\frac{1}{R_1 + sL_{lk1}} + \frac{1}{sL_{M1}}\right) + 1\right]} \quad (4)$$

When modeling the performance of the PCB-based transformers of the present invention there are further considerations that need to be taken into account, notably the AC winding resistance, the nature of the load, and the resonant frequency.

The AC resistance of the windings increases with the operating frequency as a consequence of skin effects. R. Goyal. "High-frequency analog integrated circuit design". J. Wiley, 1995, pp 110-125 gives a skin effect equation and by modification of this equation to the present model the winding resistance is given by:

$$R(f) = R_o\left[1 + \frac{f}{f_a} + \left(\frac{f}{f_b}\right)^2\right]^{\frac{1}{4}} \quad (5)$$

Where $R_o$ is the dc resistance of the conductor, f is the operating frequency, and $f_a$ and $f_b$ are critical frequencies of the conductor. This frequency-dependent winding resistance is used in the model for performance evaluation.

As the transformers of the present invention are particularly designed for and to be tested in MOSFET/IGBT gate drive circuits, the load condition needs to be taken into account. In practice the gate-source load of power devices can be treated approximately as a capacitive and resistive load. FIG. 2 can easily be modified to produce FIG. 3 as the equivalent circuit for a capacitive load.

Turning to resonant frequency, the equivalent inductance, $L_{eq}$, is given by $$L_{eq} = L'_{lk2} + L_{lk1} \| L_{M1} \quad (6)$$

The equivalent capacitance of the circuit is given by $$C_{eq} = C'_L + C'_2 + C'_{12} \quad (7)$$

From Eqs. (6) and (7), $L_{eq}$ and $C_{eq}$ are functions of inductances and capacitances, respectively, referred to the primary side. The resonant frequency is given by:

$$f_o = \frac{1}{2\pi\sqrt{L_{eq}C_{eq}}} \quad (8)$$

To use this model to evaluate the performance of the transformers of the present invention, the parameters required by the model must be measured experimentally. As the coreless transformers are designed to operate at high-frequency (in the range of from a few hundred kHz to a few MHz), the model resistance and inductance are measured with a Hewlett-Packard impedance analyser at about 1 MHz initially. The measured parameters are shown in Table 1.

TABLE 1

|  | $R_1$ (Ω) | $L_{lk1}$ (µH) | $L_{M1}$ (µH) | $R_2$ (Ω) | $L_{lk2}$ (µH) |
|---|---|---|---|---|---|
| FIG. 1(a) | 0.80 | 1.10 | 2.03 | 4.08 | 0.98 |
| FIG. 1(b) | 1.84 | 0.67 | 1.79 | 3.78 | 0.96 |
| FIG. 1(c) | 0.60 | 0.37 | 0.73 | 0.86 | 0.41 |

TABLE 1-continued

|  | $R_1$ (Ω) | $L_{lk1}$ (µH) | $L_{M1}$ (µH) | $R_2$ (Ω) | $L_{lk2}$ (µH) |
|---|---|---|---|---|---|
| FIG. 1(d) | 0.73 | 0.43 | 0.85 | 1.30 | 0.53 |
| FIG. 1(e) | 0.43 | 0.22 | 0.65 | 2.43 | 1.17 |

It can be seen that in general the mutual inductance increases with the area of the windings. The winding resistance of the smaller transformers of FIGS. 1(c)-(d) are measured from 10 kHz to 10 MHz by the impedance analyser. Their DC resistances and critical frequencies are given in Table 2.

TABLE 2

|  |  | $R_o$(Ω) | $f_a$ (MHz) | $f_b$ (MHz) |
|---|---|---|---|---|
| FIG. 1(c) | Primary | 0.45 | 0.49 | 1.7 |
| FIG. 1(c) | Secondary | 0.68 | 0.63 | 2.0 |
| FIG. 1(d) | Primary | 0.55 | 0.51 | 1.9 |
| FIG. 1(d) | Secondary | 1.1 | 0.90 | 3.9 |
| FIG. 1(e) | Primary | 0.285 | 0.33 | 0.98 |
| FIG. 1(e) | Secondary | 2.06 | 1.20 | 3.9 |

The calculated and measured ac windings resistances are compared and are found to be consistent as shown in FIGS. 4(a) & (b). Finally, the model capacitance of the transformers measured at 1 MHz are given in Table 3

TABLE 3

|  | $C_1$ (pF) | $C_2$ (pF) | $C_{12}$ (pF) |
|---|---|---|---|
| FIG. 1(a) | 2.3 | 2.79 | 37 |
| FIG. 1(b) | 1.33 | 1.51 | 20.3 |
| FIG. 1(c) | 0.24 | 0.43 | 11.5 |
| FIG. 1(d) | 0.65 | 0.82 | 14.9 |
| FIG. 1(e) | 0.11 | 0.79 | 10.7 |

With these measured values for the model parameters and equations (6) to (8) the performance of the transformers of FIGS. 1(a)-(e) may be measured and simulated, and simulated results may be compared with measured values to ensure that the simulation is accurate for those values and characteristics simulated only and not measured.

The frequency response of the coreless PCB transformers are determined under both resistive and capacitive loads.

Figure 5B:
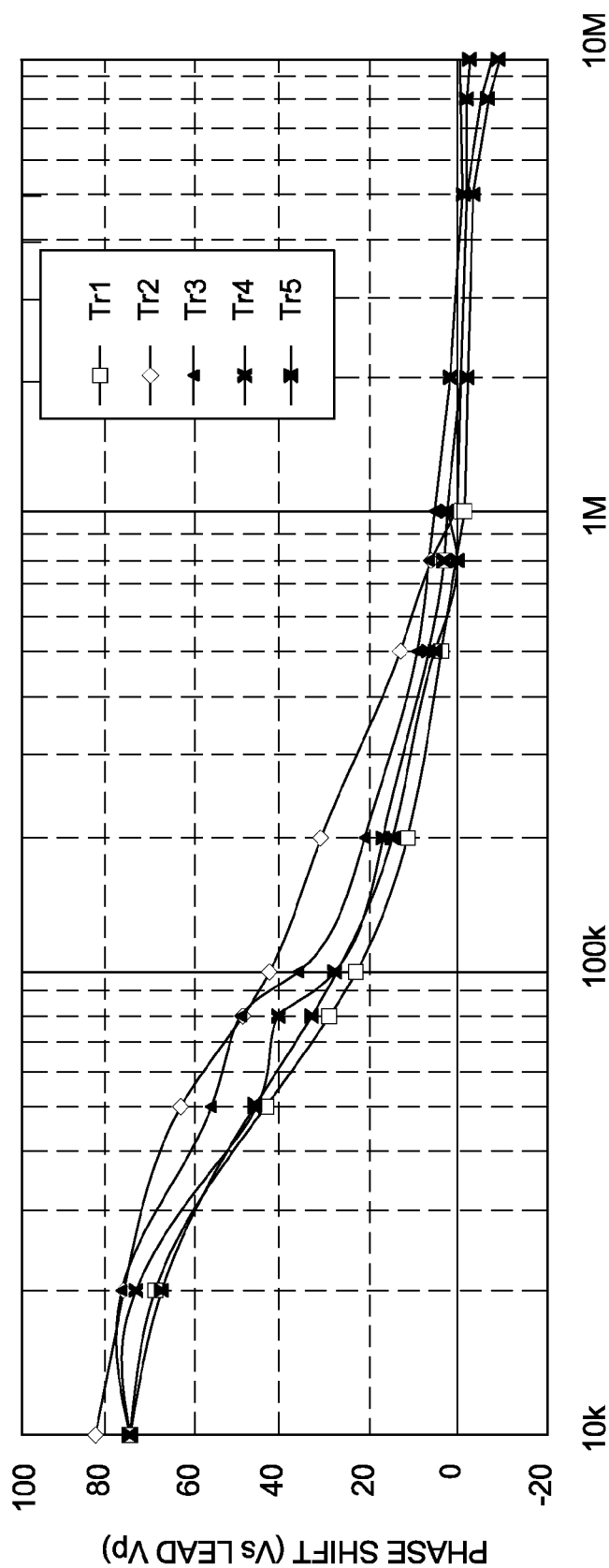

The coreless transformers are tested with a resistive load of 1 kΩ. As can be seen from Table 3 the values for $C_1$ and $C_2$ are a few pico-Farads and so the probe capacitance must be considered in the measurements. Two oscilloscope probes (each having a probe capacitance of 14 pF and a bandwidth of 350 MHz) are used in this experiment. The computed frequency responses are shown in FIGS. 5(a) & (b). FIG. 5(a) shows the simulated voltage gain for the transformers of FIGS. 1(a)-(e), while FIG. 5(b) shows the simulated phase shift for the coreless PCB transformers of FIGS. 1(a)-(e). As can be seen from FIG. 5(a) the voltage gain is found to have a wide operating range from a few hundred Hertz up to at least 10 MHz with a 1 kΩ resistive load.

Figure 6B:
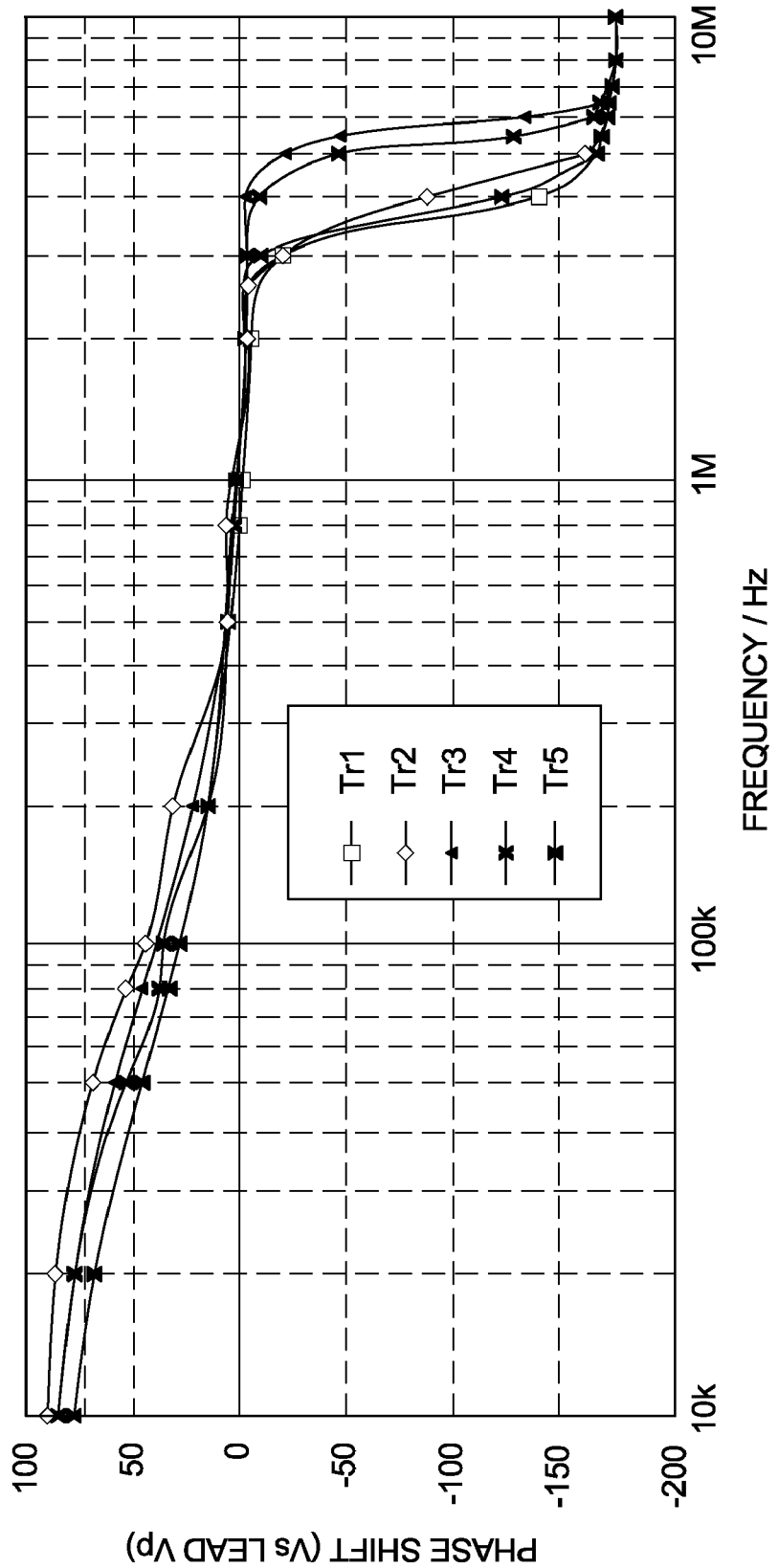

However, one of the main objectives for the coreless PCB transformers of the present invention is to provide electrical isolation for power MOSFET and IGBT circuits. In such applications the loads would be effectively capacitive since both power MOSFETs and IGBTs have a gate capacitance ranging from several hundred pico-Farads to a few nano-Farads. In order to study the performance of coreless PCB transformers of the present invention in such a situation a capacitive load is connected to the secondary terminals of the transformers. The probe capacitance is included in the capacitive load the total capacitance of which is 980 pF. A 100 kΩ resistor is used to simulate the resistive component of a typical gate drive circuit. FIG. 6(a) shows the voltage gain of the transformers of FIGS. 1(a)-(e) with this capacitive load, while FIG. 6(b) shows the corresponding phase shift.

FIG. 6(a) shows clear resonance peaks at certain frequencies for the voltage gain. From the measured values of the model parameters these resonant frequencies are expected to be as given in Table 4.

TABLE 4

|  | Resonant Frequency (MHz) |
| --- | --- |
| FIG. 1(a) | 3.52 |
| FIG. 1(b) | 3.89 |
| FIG. 1(c) | 5.79 |
| FIG. 1(d) | 5.17 |
| FIG. 1(e) | 3.86 |

These calculated values compare well with the values obtained from FIG. 6(a).

A comparison of FIGS. 5(a) and 6(a) show that a load capacitance lowers the resonant frequency of the coreless PCB transformers of the present invention and thus reduces the maximum operating frequency of the gate drive circuits. Nonetheless the results show that the coreless PCB transformers of the present invention can be operated in a range of from a few kHz to a few MHz for a MOSFET/IGBT which has a gate capacitance ranging typically from a few hundred pico-Farads to a few nano-Farads.

To further confirm these observations, the transformer of FIG. 1(c) is also simulated using PSpice (a circuit simulation software package) and FIGS. 7(a) and (b) show respectively the voltage gain and phase shift (with a resistive load) from measurements, MATLAB (a software maths package) calculations and PSpice simulations. It will be seen that the measured, calculated and simulated results all agree closely. FIGS. 8(a) and (b) show the corresponding results under a capacitive load and again all three curves agree closely.

FIG. 9 plots the power loss of the transformer of FIG. 1(c) when operated in a practical gate drive circuit of FIG. 10 over a range of frequencies. It can be observed from FIG. 9 that the power loss decreases with frequency. The reason for this is that (a) there is no core loss (which in a conventional transformer increases with frequency) and (b) the magnetising current decreases with increasing frequency because the impedance of the magnetising inductance increases with frequency. This reduction of power loss at high frequency demonstrates a significant advantage of the coreless PCB transformers of the present invention when operated at high frequency.

FIG. 10 shows a MOSFET gate drive circuit employing a coreless PCB transformer 1 of the present invention. FIG. 10 shows the transformer 1 isolating the gate of MOSFET type APT5040 (to the right of the transformer in the Figure) from a floating 15V power supply (to the left of the transformer in the Figure). The MOSFET APT5040 has a gate capacitance of 1430 pF. The gate drive is found to be successful in the operating range of from 500 kHz to 2 MHz and within a duty cycle range of 0.08 to 0.87. Tests were also performed replacing the APT5040 MOSFET with and IRF450 MOSFET with a gate capacitance of 2700 pF. FIGS. 11, 12 and 13 show respectively the measured gate-source (upper trace) and drain-source (lower trace) voltage waveforms of the power MOSFET IRF450 at 500 kHz, 1 MHz and 2 MHz respectively. FIGS. 14 and 15 show the 1 MHz waveform of a power MOSFET APT5040 and a IGBT IRGPH40 KD2 respectively. FIG. 16 shows the switching waveform of a MOSFET IRF450 at a duty cycle of 10%, and FIG. 17 shows the waveform when the duty cycle is 80%.

FIGS. 11 to 17 show that the coreless PCB transformers of the present invention are well adapted to function in isolated gate drive circuits for power MOSFETs and IGBTs at a high operating frequency. However, as FIG. 9 indicates the transformers of FIGS. 1(a)-(e) are less suitable at low operating frequencies, eg in a range below 300 kHz. The main reason for this is that the magnetising reactance of the coreless PCB transformers of the present invention decreases with decreasing frequency and thus the voltage gain is low in the low-frequency range. At extremely low switching frequencies (a few Hertz for example), the printed planar windings with only a few turns (10 say) behave almost like short-circuit paths, making the primary winding current unacceptably large and the voltage gain too low.

The power loss of a gate drive circuit including a coreless PCB transformer includes the power loss in the transformer itself and the power loss in the gate drive circuit components. At a low operating frequency the transformer loss becomes excessive. In general the overall power loss decreases with increasing operating frequency until the switching loss in the components becomes dominant. The following embodiment of the present invention provides a solution to this low frequency problem.

In general, the voltage gain of the transformer of FIG. 1(c) is sufficiently high (>0.8 in this example) for gate drive application from 200 kHz to about 5 MHz. Primarily due to the load capacitance and the equivalent leakage inductance of the transformer, resonance occurs at about 5.5 MHz for the transformer of FIG. 1(c). In the Mega-Hertz range below the resonance frequency, the phase shift is very small.

Observation of this typical frequency response leads to the following important points that can be considered to operate the coreless transformer in an optimal manner:

(i) The voltage gain of the transformer drops to zero beyond the resonant frequency. Thus the useable frequency range must be below the resonant frequency.

(ii) The operating frequency of the coreless transformer should be near or at the high-frequency end of the useable operating range (so that the magnetizing reactance is large) in order to minimize the input current and hence the power of the gate drive circuits.

(iii) Near the resonance region (just below the resonant frequency), the voltage gain is higher than the rest of the operating range. One can take advantage of this high-gain region in order to achieve fast switching time for power MOSFETs or IGBTs.

(iv) The optimal operating frequency, which combines the benefits of (i) and (ii), should be the frequency at which the input impedance of the overall transformer isolated equivalent circuit is at its maximum. At (or near) this maximum-impedance frequency, the power consumption of the coreless PCB transformer gate drive can be minimized.

The dimension of a coreless PCB transformer according to a further embodiment of the invention is shown in FIG. 19. The area of the transformer in FIG. 19 is roughly 25% of that of the transformer of FIG. 1(c), and is much smaller than a typical pulse transformer. Because the intra-winding capacitance of the transformer of FIG. 19 is negligible (when measured at 10 MHz), the circuit model can be simplified as shown in FIG. 20. The inductive components of the circuit model are calculated by the analytical method proposed by Hurley and Duffy [W. G. Hurley and M. C. Duffy, *"Calculation of self and mutual impedances in planar magnetic structures", IEEE Trans. On Magnetics*, Vol. 31. No. 4, Jul. 1995, pp. 2416-24221] and are also computed using Ansoft 2-dimensional finite-element EM field solver. The width and height of the copper track are 0.22 mm and 0.025 mm, respectively. The distance between adjacent tracks is about 0.28 mm. The number of turns for the primary and secondary printed windings is 10. The interwinding capacitor $C_{12}$ is calculated by assuming that each coil is a solid conducting plain. The parameters are measured at 10 MHz with a HP 4194A impedance analyzer. The calculated $C_{12}$ is 3.5 pF, which is the same as the measured value. The calculated, computed and measured values of the inductive parameters are listed in Table 5. The inductance of the leads connected to the windings is found to be about 36 nH. Excluding this external inductance, the corrected measured inductive component values are given in Table 5. It is found that these values are in good agreement in general. The difference in the calculated and measured magnetizing inductance is only about 3.3%.

TABLE 5

Calculated, computed and measured values for inductive circuit components

|  | Hurley and Duffy's method | Ansoft | Measurements |
|---|---|---|---|
| $L_{lk1}$ | 267 nH | 268 nH | 268 nH (+36 nH) |
| $L_{lk2}$ | 267 nH | 268 nH | 268 nH (+36 nH) |
| $L_m$ | 266 nH | 262 nH | 275 nH |

Figure 22B:
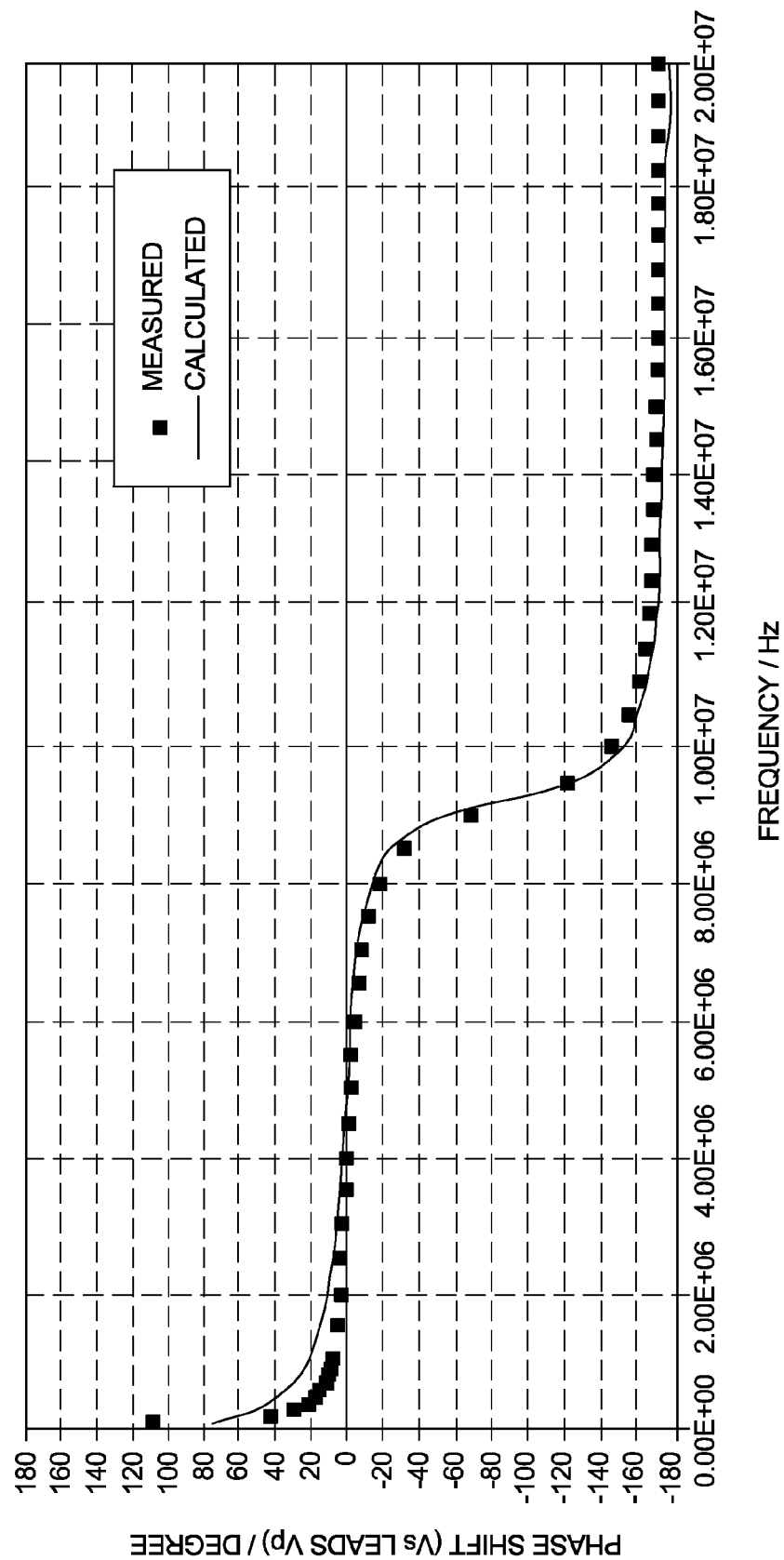

From here onwards, $C_1$ and $C_2$ in the following analysis of optimal gate drive conditions represent the equivalent circuit capacitance that appear in the primary winding and the secondary windings, respectively. Based on this high-frequency model, the voltage gain ($V_2/V_1$) and the input impedance ($Z_{in}$, referred to the primary side) of the careless transformer can be expressed as follows:

$$\frac{V_2}{V_1} = B = \frac{\frac{1}{X_1} + sC_{12}Y_1}{nY} \qquad (9)$$

and $$Z_{in} = \frac{1}{sC'_{12}(1-nB) + \frac{(1-A)}{X_1} + sC'_1} \qquad (10)$$

where $R'_2 = n^2 R_2$ $L'_{lk2} = n^2 L_{lk2}$ $C'_1 = C_1 + \frac{n-1}{n} C_{12}$ $C'_2 = \frac{1}{n^2} C_2 + \frac{1-n}{n^2} C_{12}$ $C'_{12} = \frac{1}{n} C_{12}$ $X_1 = R_1 + sL_{lk1}$ $X_2 = R'_2 + sL'_{lk2}$ $Y_1 = X_2 \left[ \frac{1}{X_1} + \frac{1}{sL_{M1}} \right] + 1$ $Y_2 = \frac{1}{X_2} + sC'_{12} + sC'_2 + \frac{1}{n^2 R_L}$ $Y = -\frac{1}{X_2} + Y_1 Y_2$ $A = \frac{sC'_{12} + \frac{X_2}{X_1} Y_2}{Y}$ The resonant frequency is given by $$f_o = \frac{1}{2\pi \sqrt{L_{eq} C_{eq}}} \qquad (11)$$

where $L_{eq} = L'_{lk2} + L_{lk1} \| L_{MS}$ and $C_{eq} = C'_2 + C'_{12}$. (Here $C'_2$ includes the load capacitance.) If CMOS logic gates are used in the control of the gate drive circuits, the rise and fall times of CMOS at 10V operation are typically 50 ns. Thus, its operating frequency is limited to 10 MHz. This frequency limitation is also the limit for the operating frequency of the gate drive circuit including the coreless transformer. In order to analyze the frequency response of the transformer of FIG. 19, the primary circuit capacitance and the load capacitance should be included. In this study, the capacitance $C_1$ is 120 pF. (This is a typically output capacitance of a buffer circuit.) The secondary winding is loaded with a resistor of 2 kΩ in parallel with a capacitor $C_2$ of 680 pF. (Note: this $C_1$ and $C_2$ are not the winding capacitance as in FIG. 3.) The choice of this load capacitor $C_2$ gives a resonant frequency to be approximately 9 MHz, which is less than the 10 MHz limit. Using (9) and (10), the predicted and measured variation of the input impedance and the frequency response with operating frequency of the transformer of FIG. 19 are plotted in FIG. 21 and FIG. 22, respectively. These results confirm that the high-frequency coreless transformer model is accurate.

Observation of these plots leads to the following important points:

1. The magnitude of the input impedance peaks at a frequency (termed "maximum-impedance frequency") which is within the useable frequency range and is slightly below the resonant frequency. For the transformer of FIG. 19, this frequency is about 8 MHz and the impedance is about 150Ω.
2. The voltage gain at this "maximum-impedance frequency" is high (about 1.8) and the enlarged output voltage can speed up the switching times of the power devices. It should be noted that, while the coreless operation has relatively low magnetic coupling than the core-based operation, the use of the resonance technique overcomes such problem and can make the voltage gain greater than unity.

3. The phase shift at this frequency is small.

Therefore, this "maximum-impedance frequency" can be chosen as the optimal operating frequency of the coreless PCB transformer if input power consumption has to be minimized. At this frequency, the input power requirement of the gate drive is minimized. It should be noted that this operating frequency is not necessarily the switching frequency of the power devices as will be explained further below. The actual switching frequency depends on the type of the gate drive circuits. If a direct gate drive circuit is used the operating frequency is identical to the switching frequency of the power devices. Direct gate drive circuits using the proposed coreless transformers thus are suitable for a few hundreds of kilo-Hertz to Mega-Hertz switching operation. If the desired switching frequency is less than the operating frequency of the coreless transformer, a modulated gate drive circuit can be used.

The use of the coreless transformer of FIG. 1(c) in a 'direct' gate drive for operation in the frequency range of a few hundreds of kilo-Hertz and 2 MHz has been described above and such embodiments of coreless transformers may be operated at high frequency in the Mega-Hertz range (maximum-impedance frequency). However, the switching frequency in many power electronics circuits ranges from a few Hertz to a few hundreds of kilo-Hertz because of the switching loss constraint. The limitation of the direct gate drive is that it cannot be employed efficiently for switching frequency in the low and medium frequency range (say less than 300 kHz). In order to design a coreless transformer isolated gate drive which can be switched in low and medium frequency range, the modulated gate drive circuit such as that described in N. Mohan, T. M. Undeland and W. P. Robbins, *Power Electronics: Converters. Applications and Design*. Second Edition, John Wiley and Sons Inc, 1995, pp. 110-125 can be used. Modulation of a high-frequency carrier by a low-frequency control enables a high-frequency coreless transformer to be used for low frequency switching. FIG. 29 shows the simplified schematic of this modulated gate drive that has a smooth transition in the duty cycle from almost zero to one. The energy transfer from the primary side is achieved by the use of a high-frequency carrier signal at the maximum-impedance frequency in the Mega-Hertz range. This minimizes the input current and thus the input power of the gate drive. The control gate signal is coupled to the secondary output by the modulation process.

Based on the concept of the modulated gate drive, a modified gate drive may be provided that operates the overall coreless transformer gate drive in an optimal manner. Aiming at (i) minimizing the input current requirement and (ii) providing a wide range of switching frequency, the modified gate drive circuit and the test circuit consisting of a resistive-inductive load (50Ω and 1.1 mH) are shown in FIG. 23. The power MOSFET driven by the modified gate drive is APT5040, which has voltage and current ratings of 500V and 16 A respectively. A capacitor of 680 pF is connected across the secondary winding so that the resonant frequency of the transformer of FIG. 19 will be set at about 9.1 MHz. The large stabilizing capacitor of 1 µF and the DC blocking capacitor of 0.1 µF in the secondary circuit will not significantly affect the frequency characteristic of the transformer because they are in series with a diode (1N4148) which has typical capacitance of only a few pico-Farads. A voltage-doubler is included in the secondary circuit in order to boost the gate drive voltage. The carrier frequency $f_c$ (i.e. the operating frequency) is set at 8 MHz which is the "maximum-impedance frequency" of the transformer. The output signal of the gate drive (i.e. the gate-source voltage $V_{gs}$ of the power MOSFET) is controlled by the input signal $V_{in}$ of the gate drive in the modulation/demodulation process. Thus, the frequency of $V_{in}$ determines the switching frequency ($f_{sw}$) of the power MOSFET.

Figure 24B:
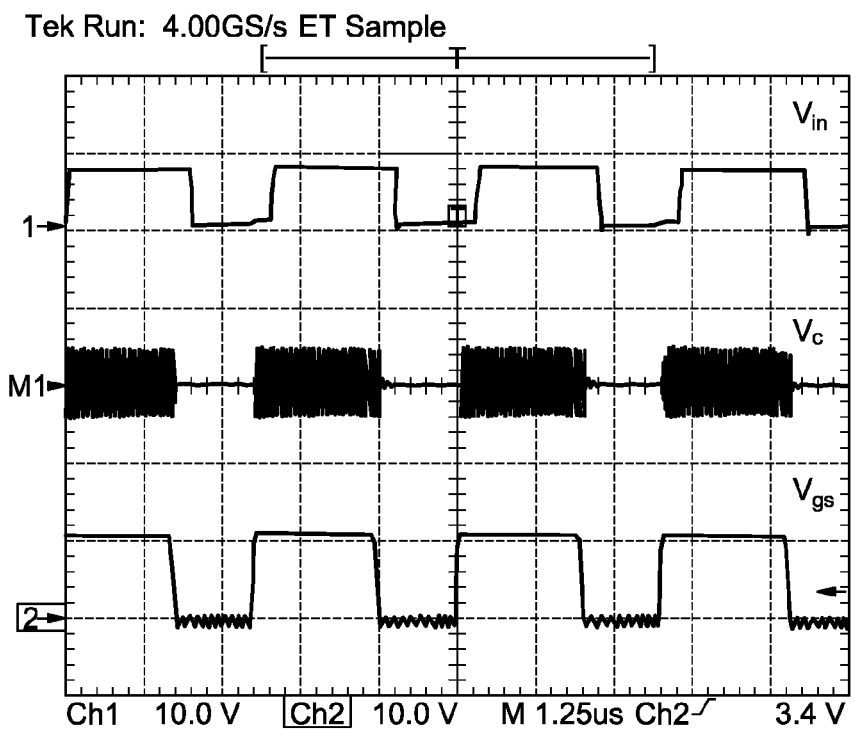

FIG. 24(a) shows the input signal ($V_{in}$) to the gate drive circuit and the gate-source voltage ($V_{gs}$) of the power MOSFET at $f_{sw}$=1 Hz. The corresponding waveforms plus the transformer's primary voltage ($V_c$) at $f_{sw}$=300 kHz are shown in FIG. 24(b). The switching waveforms of the gate-source ($V_{gs}$) and drain-source ($V_{ds}$) of the power MOSFET at 1 Hz and 300 kHz are shown in FIG. 25(a) and FIG. 25(b), respectively. Typical switching waveforms of the drain-source voltage $V_{ds}$ and drain current $I_d$ of the power MOSFET at a switching frequency of 100 kHz are recorded in FIG. 26. These practical results confirmed the successful implementation of the coreless transformer of FIG. 19 in the modified modulated gate drive circuit. In order to confirm the minimum input power requirement of the driving conditions, the input current of the gate drive circuit under the condition of 100% duty cycle is measured at various carrier frequencies within the useable frequency range. Under 100% duty cycle, the power consumption of the gate drive is at its maximum (i.e. the worst-case situation). The input current versus carrier frequency under such worst case situation is plotted in FIG. 27. It can been seen that the input current is minimum at approximately 8 MHz—the "maximum-impedance frequency" of the transformer in the gate drive design. This result confirms the optimal operating conditions of the proposed gate drive design using the coreless PCB transformer. For a dc voltage supply of 10V used in the primary gate drive circuit, the maximum power consumption of the gate drive under the worst condition is less than 0.9 W.

When used for energy transfer (such as in a power converter), the coreless PCB transformer is expected to operate at its maximum energy efficiency conditions. Another coreless PCB transformer (shown in FIG. 30) is used in this analysis. This transformer has 19 turns in the primary winding and 19 turns in the secondary winding. The thickness of the PCB is 0.4 mm. The outer radius of the printed winding is about 5.5 mm. This transformer has an equivalent circuit as shown in FIG. 31. The parameters of the transformer of FIG. 30 are $L_{lk1}$=0.35595 µH; $L_{lk2}$=0.35595 µH; $L_{M1}$=1.4936 µH. The effect of $C_{12'}$ is neglected in order to simplify the analysis.

Power dissipation of the transformer due to the conductor loss is $$P_{Loss}=|i_1|^2 R_1 + |i_2|^2 R_2 \qquad (12)$$

$R_1$ and $R_2$ represent the resistances of the transformer primary and secondary windings, respectively. They are functions of operating frequency due to skin effect. The measured relationships between the resistance and frequency are in the form of Equation (13).

$$R_1 = 1.7819 \times 10^{-15} f^2 + 1.8209 \times 10^{-7} f + 1.2369 \qquad (13a)$$

$$R_2 = 1.7819 \times 10^{-15} f^2 + 1.8209 \times 10^{-7} f + 1.2369 \qquad (13b)$$

where f is the operating frequency.

In Equation (12), $i_1$ and $i_2$ are the primary and secondary windings currents respectively.

$$\begin{cases} i_1 = \dfrac{R'_2 + s(L'_{lk2} + L_M) + Z'_L}{[R_1 + s(L_{lk1} + L_M)][R'_2 + s(L'_{lk2} + L_M) + Z'_L] - s^2 L_M^2} v_{in} & (6) \\ i_2 = \dfrac{sL_M}{[R_1 + s(L_{lk1} + L_M)][R'_2 + s(L'_{lk2} + L_M) + Z'_L] - s^2 L_M^2} v_{in} & (7) \end{cases}$$

where $$Z'_L = \dfrac{1}{sC'_2} \| R'_L$$
$$= \dfrac{R'_L}{1 + sR'_L C'_2}$$

Power delivered to the load, $Z_L$, is $$P_{Load} = \dfrac{|i_2 Z'_L|^2}{R'_L} = |i_2|^2 \dfrac{|Z'_L|^2}{R'_L} \quad (16)$$

Energy efficiency of the transformer is defined as $$\eta = \dfrac{P_{Load}}{P_{Load} + P_{Poss}} \times 100\% \quad (17)$$

Put (12), (14), (15) and (16) into (17), then the efficiency of the transformer becomes $$\eta = \dfrac{\left|\dfrac{sL_M R'_L}{1 + sR'_L C'_2}\right|^2 \dfrac{1}{R'_L}}{\left|\dfrac{sL_M R'_L}{1 + sR'_L C'_2}\right|^2 \dfrac{1}{R'_L} + \left|R'_2 + s(L'_{lk2} + L_M) + \dfrac{R'_L}{1 + sR'_L C'_2}\right|^2 R_1 + |sL_M|^2 R'_2} \times 100\% \quad (18)$$

The use of capacitor $C_2$ is to increase the gain ($V_s/V_{in}$), input impedance ($Z_{in}$), and the transformer efficiency ($\eta$). The choice of $C_2$ can also determine the resonant frequency of the transformer circuit. In this analysis, a 100 pF capacitor $C_2$ is connected in parallel with the secondary winding of the transformer. The gain ($V_s/V_{in}$), input impedance ($Z_{in}$), and the efficiency ($\eta$), of the transformer versus operating frequency are plotted in FIG. 32 to FIG. 34, respectively. The load resistance ($R_L$) varies from 50Ω to 500Ω with 50Ω incremental step.

With $C_2$=100 pF, FIG. 32 shows that the resonant frequency of the transformer of FIG. 30 is greater than 15 MHz (around 18 MHz to 19 MHz depending on the load resistance). FIG. 33 indicates that the maximum impedance frequency (MIF) occurs at around 11 MHz. The efficiency curves for various load resistances are plotted in FIG. 34. It can be seen that the maximum efficiency frequency (MEF) is slightly less than the MIF (around 9 MHz to 10 MHz). In fact, the transformer can be operated with the frequency range of 8 MHz to 11 MHz in order to achieve high efficiency (say >90%).

When the load resistance is very large, i.e. load power is very low, the load current and $i_2$ are very small that the power dissipation of the transformer is dominated by $i^2R$ loss component due to the current $i_1$. On the other hand, increasing the transformer input impedance reduces the primary winding current, $i_1$. Thus, the MEF tends to MIF as the load current is small. For example, power consumption of MOSFET/IGBT gate drive circuits is small enough that the MEF is regarded as the MIF.

When the load resistance decreases, i.e. load power increases, Equation (12) shows that the increasing secondary winding current, $i_2$, will increase the transformer $i^2R$ loss. From Equation (13), the winding resistance increases as operating frequency increases. As a result, operating the transformer in lower frequency can reduce the power loss of the transformer when $i_2$ is significant. As shown in FIG. 34, the MEF is below the MIF. MEF increases when the load resistance increases (i.e. the load power decreases).

The transformer of FIG. 30 is also studied with a larger capacitance $C_2$. As the $C_2$ increases, the voltage gain, resonance frequency, MIF and the MEF decrease. An example with $C_2$=1000 pF is used to illustrate the phenomena. FIG. 35 to FIG. 37 show the frequency response of the gain ($V_s/V_{in}$), input impedance ($Z_{in}$) and the efficiency ($\eta$) of the transformer, respectively. The resonant frequency is now set at about 6 MHz. The MIF is about 3.8 MHz and the MEF is about 3.2 MHz. Thus, the coreless PCB transformer, when used in a power converter, should be operated at the MEF (which is lower than the MIF) in order to achieve maximum energy efficiency.

It will thus be seen that optimal operating techniques for using a coreless PCB transformer under (1) minimum input power requirement and (2) maximum energy efficiency have been described above. The optimal operation of a coreless PCB transformer in an isolated gate drive circuits for power MOSFET/IGBT devices has been successfully demonstrated for a wide frequency range from 1 Hz to 300 kHz. Criteria for selecting the optimal operating conditions for the coreless transformer in gate drive (energy and signal transfer) applications are developed, presented and experimentally verified. It is found that coreless transformers should be operated at or near their "maximum-impedance frequencies" so that the input power requirement can be minimized and the voltage gain is high. This optimal operating condition of the coreless transformer has been demonstrated in the "modulated" gate drive circuit and can also be applied to the "direct" gate drive. For both types of isolated gate drive circuits, the operating frequency of the transformers are always chosen to their "maximum-impedance frequencies". For the modulated transformer-isolated gate drive circuit, the carrier frequency of the transformer circuit is chosen to be the maximum-impedance frequency of the transformer. The transmitted signal (which has a frequency lower than the carrier frequency) can be recovered in the demodulation process. For the direct gate drive, the signal is simply transmitted at the maximum-impedance frequency of the transformer. The choice of optimal operating frequency of the transformer circuit can be very flexible because the resonant frequency and thus the maximum-impedance frequency of the transformer circuit can be precisely determined by the size of the external capacitor $C_2$. Procedures for selecting the parameters for the modulated gate drive have also been described above. When used with coreless transformers, direct gate drives are found to be suitable for high (Mega-Hertz) switching frequency. The modulated gate drive should be used for low and medium (say less than 300 kHz) switching operation. The size of the coreless transformer of FIG. 19 is about 25% of that of the other embodiments and is much smaller than that of a typical core-based high-frequency pulse transformer in terms of both area and volume.

When used for electrical energy transfer such as in a power converter, the coreless PCB transformers should be operated at or near their maximum efficiency frequency (MEF) which is found to be lower than the maximum impedance frequency (MIF).

Coreless transformers are cheaper than core-based transformers. They eliminate the requirements of magnetic core and manually-wound transformers. Consequently, automation in the manufacturing process of gate drive circuits becomes feasible and the manufacturing cost can be reduced. In conclusion, it is demonstrated that magnetic core is not a necessary item in transformer isolated gate drive circuits. The same idea can, in principle, be applied to low-power converters. Coreless PCB transformers are particularly suitable for use in applications in which stringent height requirements have to be met.

The invention claimed is:

1. A coreless transformer, comprising first and second windings, said first winding being disposed in a first plane, said second winding being disposed in a second plane proximate and parallel to said first plane, wherein said transformer is adapted to be operated by a high-frequency carrier signal modulated by a low-frequency non-zero switching signal, and wherein said transformer is adapted to be operated only at a frequency that is less than a resonant frequency of said transformer.

2. The transformer as claimed in claim 1, wherein said carrier signal is at an optimum frequency, said optimum frequency being a frequency at which an input impedance of said transformer is a maximum.

3. The transformer as claimed in claim 1, wherein said high frequency carrier signal is in a range of from 300 kHz to 20 MHz and said low frequency non-zero switching signal is in a range of from above DC to 300 kHz.

4. A coreless transformer comprising first and second windings, said first winding being disposed in a first plane, said second winding being disposed in a second plane proximate and parallel to said first winding plane, further comprising means for adjusting a resonant frequency of the transformer, wherein said transformer is adapted to be operated only at a frequency that is less than said resonant frequency of said transformer.

5. The transformer as claimed in claim 4, wherein said adjusting means comprises a capacitance connected directly across the second winding.

6. A method of operating a coreless planar transformer, wherein said transformer is operated at an optimum frequency which is at or near the frequency at which the impedance of a transformer equivalent circuit is at its maximum and which is less than the resonant frequency of the transformer.

7. A method as claimed in claim 6 wherein the transformer is operated at a frequency of between 100 kHz and 20 Mhz.

8. A method as claimed in claim 6 wherein said transformer is operated by a high-frequency carrier signal modulated by a low frequency non-zero switching signal, said carrier signal being at said optimum frequency.

9. A method as claimed in claim 8 wherein said switching signal is at a frequency of less than 300 kHz.

10. A method of driving a gate of a power MOSFET or IGBT device comprising isolating said gate from a power supply by means of a coreless planar transformer and driving said gate at an optimum frequency which is at or near the frequency at which the impedance of a transformer equivalent circuit is at its maximum and which is less than the resonant frequency of the transformer.

11. A method as claimed in claim 10 wherein said gate is driven at a frequency in the range of from about 100 kHz to 20 MHz.

12. A method as claimed in claim 10 wherein a low frequency non-zero switching signal is used to modulate a high-frequency carrier signal input to said transformer, and wherein said carrier signal is demodulated after said transformer to drive said gate at said low switching frequency, said carrier signal being at said optimum frequency.

13. A method as claimed in claim 12 wherein said switching signal is at a frequency of less than 300 kHz.

14. A coreless transformer comprising first and second windings, said first winding being disposed in a first plane, said second winding being disposed in a second plane proximate and parallel to said first plane, said coreless transformer further comprising a capacitance across said second winding to resonate with said coreless transformer in order to maximize an input impedance of the coreless transformer, wherein an operating frequency of the coreless transformer is less than a resonant frequency of the transformer.

15. The coreless transformer of claim 14, wherein said operating frequency is between 300 kHz and 20 MHz.

* * * * *